(12) United States Patent
Jang et al.

(10) Patent No.: US 10,340,425 B2
(45) Date of Patent: Jul. 2, 2019

(54) LIGHT EMITTING DIODE HAVING LIGHT BLOCKING LAYER

(71) Applicant: Seoul Viosys Co., Ltd., Ansan-si (KR)

(72) Inventors: Jong Min Jang, Ansan-si (KR); Chang Yeon Kim, Ansan-si (KR); Jae Hee Lim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/816,201

(22) Filed: Nov. 17, 2017

(65) Prior Publication Data

US 2018/0151780 A1 May 31, 2018

(30) Foreign Application Priority Data

Nov. 25, 2016 (KR) .................. 10-2016-0158391
Feb. 24, 2017 (KR) .................. 10-2017-0024857

(51) Int. Cl.
| | | |
|---|---|---|
| *H01L 33/00* | (2010.01) | |
| *H01L 33/46* | (2010.01) | |
| *H01L 33/10* | (2010.01) | |
| *H01L 33/22* | (2010.01) | |
| *H01L 33/24* | (2010.01) | |

(Continued)

(52) U.S. Cl.
CPC .............. *H01L 33/46* (2013.01); *H01L 33/10* (2013.01); *H01L 33/22* (2013.01); *H01L 33/24* (2013.01); *H01L 33/62* (2013.01); *H01L 33/20* (2013.01); *H01L 33/382* (2013.01); *H01L 33/44* (2013.01);

(Continued)

(58) Field of Classification Search
None
See application file for complete search history.

(56) References Cited

U.S. PATENT DOCUMENTS 6,730,940 B1 * 5/2004 Steranka ............... H01L 33/46
257/98
9,024,340 B2 * 5/2015 Minato ............... H01L 33/505
257/98

(Continued)

FOREIGN PATENT DOCUMENTS

| EP | 1416545 | 5/2004 |
| EP | 2216834 | 8/2010 |

(Continued)

OTHER PUBLICATIONS

European Search Reported dated Jan. 18, 2018, issued in European Patent Application No. 17203430.

*Primary Examiner* — Minh Loan Tran

(74) *Attorney, Agent, or Firm* — H.C. Park & Associates, PLC

(57) ABSTRACT

A light emitting diode including a light blocking layer is disclosed. The light emitting diode includes: a substrate including an upper surface and side surfaces; a semiconductor stack disposed under the substrate and including a first conductivity type semiconductor layer, a second conductivity type semiconductor layer, and an active layer interposed between the first conductivity type semiconductor layer and the second conductivity type semiconductor layer; and a light blocking layer covering the upper surface and the side surfaces of the substrate to define a light emitting surface on the upper surface of the substrate. The size of a light emitting surface of the light emitting diode can be easily controlled using the light blocking layer.

18 Claims, 26 Drawing Sheets

(51) Int. Cl.
*H01L 33/62* (2010.01)
*H01L 33/20* (2010.01)
*H01L 33/38* (2010.01)
*H01L 33/44* (2010.01)

(52) U.S. Cl.
CPC ............... *H01L 2933/0025* (2013.01); *H01L 2933/0033* (2013.01)

(56) References Cited

U.S. PATENT DOCUMENTS

| | | |
|---|---|---|
| 9,076,937 B2 | 7/2015 | Akimoto et al. |
| 9,379,287 B2 * | 6/2016 | Yoneda ................. H01L 33/486 |
| 2006/0133615 A1 | 6/2006 | Bade et al. |
| 2006/0284198 A1 | 12/2006 | Huang |
| 2009/0057702 A1 * | 3/2009 | Chiu ....................... H01L 33/46 257/98 |
| 2016/0118548 A1 | 4/2016 | Kawaguchi et al. |
| 2017/0229430 A1 * | 8/2017 | Lai ...................... H01L 25/0753 |

FOREIGN PATENT DOCUMENTS

| | | |
|---|---|---|
| EP | 2642537 | 9/2013 |
| JP | 59-112668 | 6/1984 |
| JP | 11-145519 | 5/1999 |
| JP | 2009-164423 | 7/2009 |
| JP | 2012-151415 | 8/2012 |

\* cited by examiner

LIGHT EMITTING DIODE HAVING LIGHT BLOCKING LAYER

CROSS-REFERENCE TO RELATED APPLICATION

This application claims priority to and the benefit of Korean Patent Application No. 10-2016-0158391, filed on Nov. 25, 2016, and Korean Patent Application No. 10-2017-0024857, filed on Feb. 24, 2017, which are all incorporated by reference for all purposes as if fully set forth herein.

BACKGROUND

Field

Exemplary embodiments relate to a light emitting diode. More particularly, exemplary embodiments relate to a light emitting diode including a light blocking layer.

Discussion of Background

Recently, group III-based nitrides, such as gallium nitride (GaN) and aluminum nitride (AlN) have been used as materials for light sources in the visible range and the ultraviolet range. In particular, blue and green light emitting diodes using indium gallium nitride (InGaN) are used in various applications, such as large natural color flat displays, signal lamps, interior lighting, high density light sources, camera flashes, high resolution output systems, and optical communication. Furthermore, the light emitting diodes exhibit good linear propagation of light and thus are broadly used in headlamps for automobiles.

Light emitting diodes are required to have various viewing angles depending upon their application. Light emitting diodes having a narrow viewing angle are more advantageously applicable to automobile headlamps or camera flashes. Light emitting diodes for a lighting apparatus having narrow directional characteristics, such as spot lighting, are required to have a narrow viewing angle. Such light emitting diodes are required to have a small size in order to reduce the viewing angle. However, size reduction of a light emitting diode chip generally results in a reduction of light output under the same current density conditions. Accordingly, in order to realize high light output using a small light emitting diode chip, it is necessary to increase current density. However, light emitting diode chips suffer from deterioration in luminous efficacy due to a "drooping" phenomenon at high current density, as is well known in the art.

Phosphors are commonly used together with a light emitting diode chip in order to realize a mixed color such as a white color. Although the phosphors are generally mixed with a transparent resin, such as a silicone resin or an epoxy resin, such resins are vulnerable to heat.

In addition, although two or more kinds of phosphors may be used in order to improve color rendering and color reproduction properties, it is difficult to achieve uniform mixing of these phosphors. As a result, color deviation is likely to occur between light emitting is diodes to which the phosphors are applied. Moreover, light subjected to wavelength conversion by one kind of phosphor can be absorbed or interfered with by another kind of phosphor, thereby providing low efficiency in wavelength conversion and making it difficult to improve the color rendering properties.

SUMMARY

Exemplary embodiments of the invention may provide a light emitting diode that has a small light emitting surface and exhibits high output performance without deterioration in luminous efficacy.

Exemplary embodiments may provide a technique that can easily adjust the size of the light emitting surface of the light emitting diode while maintaining high output performance of the light emitting diode.

Exemplary embodiments may provide a light emitting diode that is configured to emit a mixed color and suitable for use under high temperature conditions.

Exemplary embodiments may provide a light emitting diode that can reduce color deviation between light emitting diodes.

Exemplary embodiments may provide a light emitting diode that can enhance light conversion efficiency while improving color rendering properties.

In accordance with an exemplary embodiment, a light emitting diode includes: a substrate including an upper surface and side surfaces; a semiconductor stack disposed under the substrate and including a first conductivity type semiconductor layer, a second conductivity type semiconductor layer, and an active layer interposed between the first conductivity type semiconductor layer and the second conductivity type semiconductor layer; and a light blocking layer covering the upper surface and the side surfaces of the substrate to define a light emitting surface on the upper surface of the substrate.

Exemplary embodiments provide a light emitting diode that can realize spot lighting by defining a light emitting surface using a light blocking layer. Furthermore, since there is no need for reduction in size of the light emitting diode, the light emitting diode can have a small light emitting surface without increasing current density, thereby realizing high output without deterioration in luminous efficacy.

Other exemplary embodiments provide a light emitting diode that employs a side reflection layer and has a distance of 50 μm from an active layer to a light exit surface in order to realize a narrow viewing angle. Furthermore, the light emitting diode does not suffer from short circuit by maintaining the distance between the side reflection layer and a metal layer, thereby securing good reliability and low deviation in electrical characteristics between light emitting diodes.

Other exemplary embodiments provide a light emitting diode that employs wavelength converters containing different kinds of phosphors to reduce color deviation between light emitting diodes, and particularly adopts ceramic plate phosphors suitable for use under high temperature conditions. Furthermore, the wavelength converters containing the different kinds of phosphors may be arranged so as not to overlap each other, thereby improving efficiency in wavelength conversion of light emitted from the light emitting diode, and different kinds of phosphors are arranged on the light emitting diode having a narrow viewing angle to prevent interference with light subjected to wavelength conversion while passing through the phosphors, thereby improving color rendering properties.

Other advantages and effects of the exemplary embodiments will become apparent from the following detailed description.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION

Figure 1:
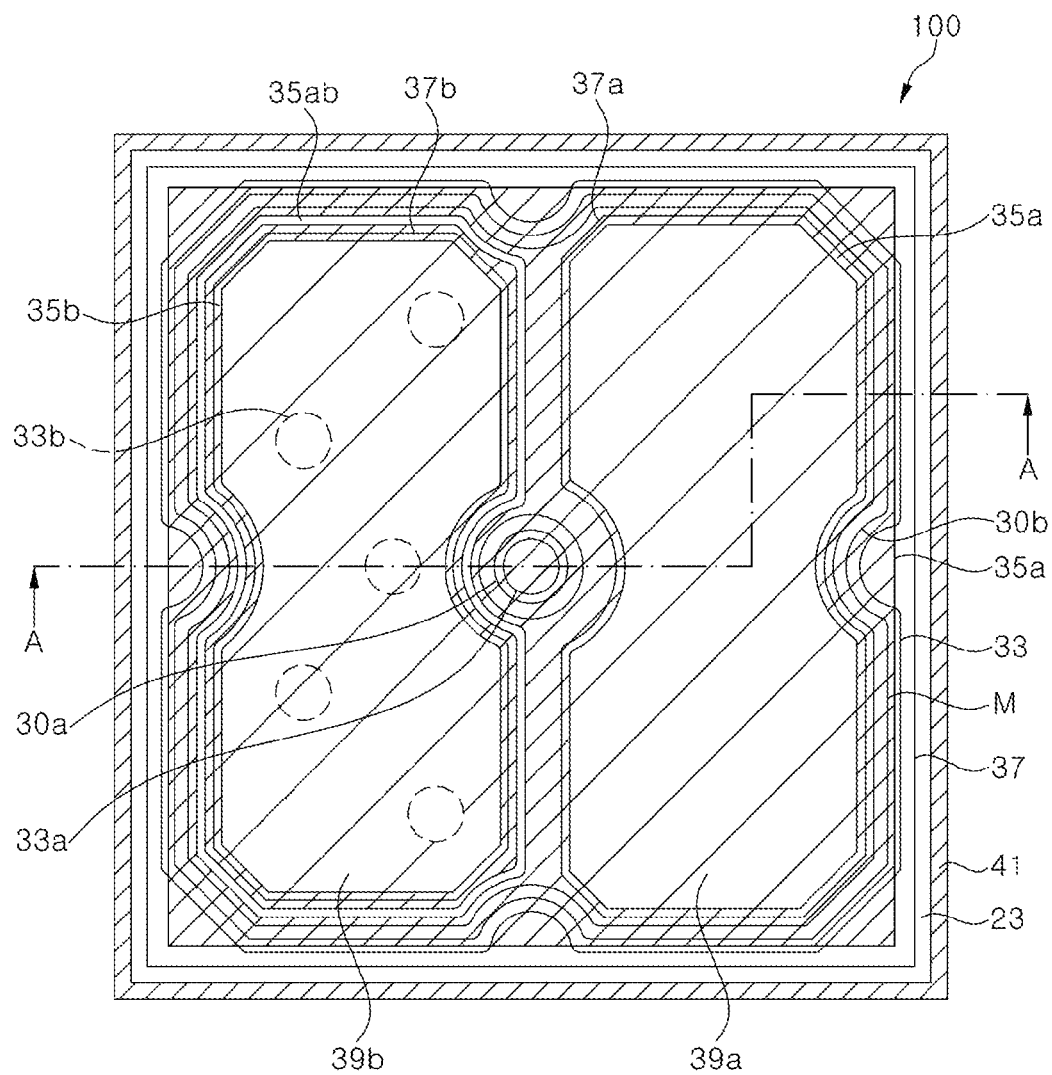
FIG. 1 is a schematic bottom view of a light emitting diode according to an exemplary embodiment.

Hereinafter, exemplary embodiments of the invention will be described in detail with reference to the accompanying drawings. The following embodiments are provided by way of example so as to fully convey the inventive concepts to those skilled in the art to which the present disclosure pertains. Accordingly, the inventive concepts are not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

In accordance with an exemplary embodiment, a light emitting diode includes: a substrate that includes an upper surface and side surfaces; a semiconductor stack disposed under the substrate and including a first conductivity type semiconductor layer, a second conductivity type semiconductor layer, and an active layer interposed between the first conductivity type semiconductor layer and the second conductivity type semiconductor layer; and a light blocking layer covering the upper surface and the side surfaces of the substrate to define a light emitting surface on the upper surface of the substrate.

The light emitting diode can realize spot lighting without reducing the size of the light emitting diode by defining the light emitting surface using the light blocking layer. Accordingly, the light emitting diode can realize high output without increasing current density, thereby preventing deterioration in luminous efficacy. Since the light emitting diode can control the light emitting surface using the light blocking layer, the light emitting diode can easily control the size of the light emitting surface without adjusting the overall size of the light emitting diode.

The light emitting surface is defined on the upper surface of the substrate and thus has a smaller area than the upper surface of the substrate. The light emitting surface may have various shapes, for example, a circular shape, an elliptical shape or a polygonal shape.

The light emitting surface may be divided into a plurality of regions by the light blocking layer. The plurality of regions may have the same shape, without being limited thereto. Further, a first region of the plurality of regions may surround a second region of the plurality of region.

In some exemplary embodiments, the light blocking layer may include a metal reflection layer. In other exemplary embodiments, the light blocking layer may include a distributed Bragg reflector. Since the light blocking layer includes the reflection layer, the reflection layer can reflect light traveling towards the light blocking layer to the outside, thereby further improving light output of the light emitting diode. The metal reflection layer can be more easily formed than the distributed Bragg reflector.

The light blocking layer disposed on the upper surface of the substrate may have a larger thickness than the light blocking layer disposed on the side surfaces of the substrate. With this structure, the light blocking layer can clearly define the light emitting surface by reducing light leakage around the light emitting surface.

The light emitting diode may further include an ohmic reflection layer electrically connected to the second conductivity type semiconductor layer; and a first bump pad and a second bump pad disposed under the ohmic reflection layer and electrically connected to the first conductivity type semiconductor layer and the second conductivity type semiconductor layer, respectively. With this structure, a flip-chip type light emitting diode can be provided.

The light emitting diode may include a mesa disposed on the first conductivity type semiconductor layer. The mesa includes the active layer and the second conductivity type semiconductor layer and is spaced apart from the side surfaces of the substrate. In addition, the light blocking layer may be spaced apart from the mesa in a lateral direction.

The light emitting diode may further include: a lower insulation layer covering the ohmic reflection layer and including a first opening exposing the first conductivity type semiconductor layer and a second opening exposing the ohmic reflection layer; a first pad metal layer disposed on the lower insulation layer and electrically connected to the first conductivity type semiconductor layer through the first opening; a second pad metal layer disposed on the lower insulation layer and electrically connected to the ohmic reflection layer through the second opening; and an upper insulation layer covering the first pad metal layer and the second pad metal layer, the upper insulation layer including a first opening exposing the first pad metal layer and a second opening exposing the second pad metal layer, wherein the first and second bump pads are disposed on the upper insulation layer and electrically connected to the first pad metal layer and the second pad metal layer through the first opening and the second opening of the upper insulation layer, respectively.

With this structure, a chip scale package type light emitting diode can be provided.

The mesa may include a through-hole formed through the second conductivity type semiconductor layer and the active layer to expose the first conductivity type semiconductor layer, and the first pad metal layer may be electrically connected to the first conductivity type semiconductor layer exposed through the through-hole.

The mesa may further include side surfaces and an indented portion formed on the side surfaces of the mesa to expose the first conductivity type semiconductor layer, and the first pad metal layer may be electrically connected to the first conductivity type semiconductor layer exposed through the indented portion.

The mesa may have cut off corners and the first pad metal layer may be electrically connected to the first conductivity type semiconductor layer at the cut off corners of the mesa.

The substrate may be a sapphire substrate or a gallium nitride-based substrate.

The substrate may have a roughened surface formed on the upper surface of the substrate such that light generated from the active layer can be discharged through the roughened surface. In one exemplary embodiment, the roughened surface may be placed only on the light emitting surface.

The side surfaces of the substrate may include a perpendicular side surface perpendicular to an upper surface of the first conductivity type semiconductor layer and an inclined side surface oblique with respect to the perpendicular side surface.

Exemplary embodiments will be described in more detail with reference to the accompanying drawings.

Figure 2:
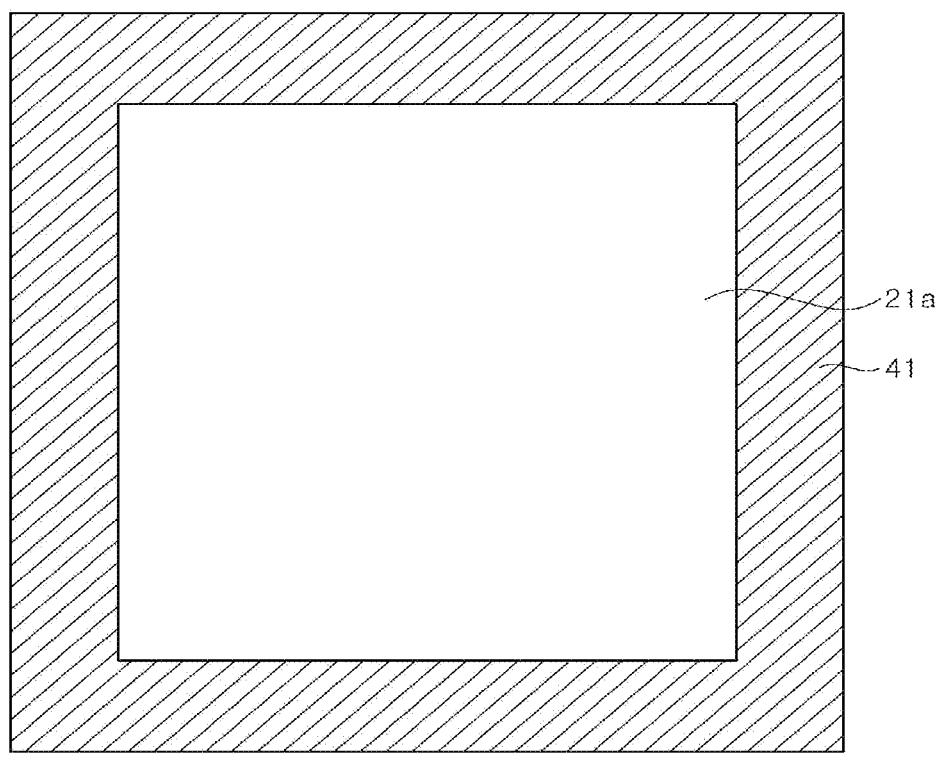
FIG. 2 is a schematic plan view of the light emitting diode according to an exemplary embodiment.
Figure 3:
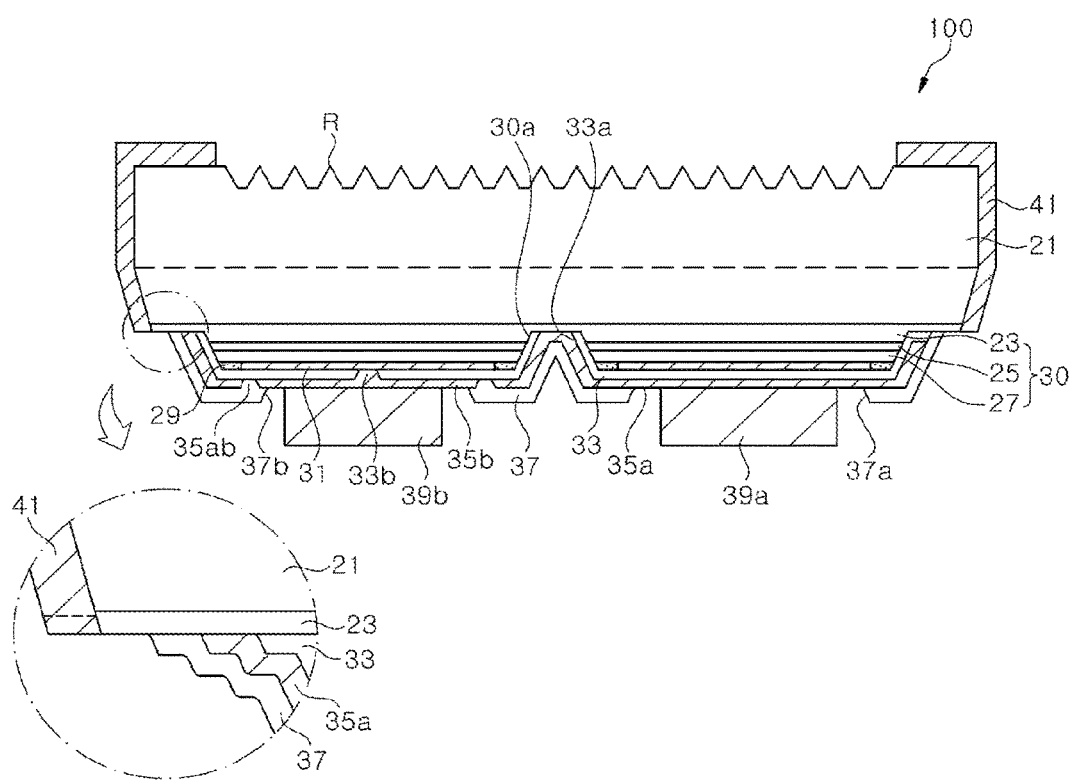
FIG. 3 is a cross-sectional view taken along line A-A of FIG. 1.

FIG. 1 and FIG. 2 are a schematic bottom view and a schematic plan view of a light emitting diode 100 according to one exemplary embodiment, and FIG. 3 is a cross-sectional view taken along line A-A of FIG. 1.

Referring to FIG. 1, FIG. 2 and FIG. 3, the light emitting diode 100 includes a substrate 21, a first conductivity type semiconductor layer 23, an active layer 25, a second conductivity type semiconductor layer 27, an ohmic reflection layer 31, a lower insulation layer 33, a first pad metal layer 35a, a second pad metal layer 35b, an upper insulation layer 37, a first bump pad 39a, a second bump pad 39b, and a light blocking layer 41. The first conductivity type semiconductor layer 23, the active layer 25 and the second conductivity type semiconductor layer 27 constitute a semiconductor stack 30. The light emitting diode may further include an ohmic oxide layer 29.

The substrate 21 is a substrate that allows growth of gallium nitride-based semiconductor layers thereon, and may be, for example, a sapphire substrate or a gallium nitride-based substrate. The sapphire substrate may be used in growth of gallium nitride-based semiconductor layers at relatively low cost. The gallium nitride-based substrate has the same or similar index of refraction to the index of refraction of the first conductivity type semiconductor layer 23 and thus allows light emitted from the active layer 25 to enter the substrate 21 without suffering from significant variation in refraction, thereby improving luminous efficacy. The substrate 21 has a roughened surface R formed on an upper surface thereof such that light can be discharged through the roughened surface of the substrate. Accordingly, the light emitting diode can have improved efficiency in extraction of light.

A distance from the active layer 25 to the upper surface of the substrate 21 may be, for example, 50 μm to 500 μm, specifically 300 μm or less, without being limited thereto. The substrate 21 may have a various size without being limited to a particular size. Here, the substrate 21 has a larger size than a light emitting surface 21a.

Although the substrate 21 is a growth substrate in this exemplary embodiment, it should be understood that other implementations are also possible. Alternatively, the substrate may be a relatively thick gallium nitride-based semiconductor layer grown on a separate growth substrate. Alternatively, a continuous layer of the first conductivity type semiconductor layer 23 may be used instead of the substrate. The separate growth substrate can be removed.

The substrate 21 may include a perpendicular side surface perpendicular to a lower surface of the substrate 21 and an inclined side surface oblique with respect to the perpendicular side surface. An angle defined between the perpendicular side surface and the inclined side surface may be about 10 degrees or more. An inclination angle of the perpendicular side surface may be determined by scribing. Laser scribing provides a steeper inclination angle than blade scribing. A boundary between the perpendicular side surface and the inclined side surface is indicated by a dotted line. The perpendicular side surface and the inclined side surface may be formed on all four side surfaces of the substrate 21.

The first conductivity type semiconductor layer 23 may be disposed on the substrate 21. Particularly, the first conductivity type semiconductor layer 23 is disposed near the inclined side surface of the substrate 21. The first conductivity type semiconductor layer 23 may be a layer grown on the substrate 21 or a gallium nitride-based semiconductor layer. The first conductivity type semiconductor layer 23 may be a gallium nitride-based semiconductor layer doped with n-type dopants, for example, Si. Here, although the first conductivity type semiconductor layer 23 is illustrated as being clearly differentiated from the substrate 21, the boundary between the first conductivity type semiconductor layer 23 and the substrate 21 may be unclear. That is, when the first conductivity type semiconductor layer 23 and the substrate 21 are formed of the same material, it can be difficult to clearly distinguish the boundary therebetween. As shown in the drawings, the first conductivity type semiconductor layer 23 may have an inclined side surface that is adjacent to the light blocking layer 41 and is adjoined to the inclined side surface of the substrate 21.

A mesa M is disposed on the first conductivity type semiconductor layer 23. The mesa M may be disposed only in a region surrounded by the first conductivity type semiconductor layer 23 such that regions near edges of the first conductivity type semiconductor layer can be exposed instead of being covered by the mesa M.

The mesa M may include the second conductivity type semiconductor layer 27 and the active layer 25. In addition, the mesa M may include a portion of the first conductivity type semiconductor layer 23 in a thickness direction thereof. The active layer 25 is interposed between the first conductivity type semiconductor layer 23 and the second conductivity type semiconductor layer 27. The active layer 25 may have a single quantum well structure or a multi-quantum well structure. The composition and thickness of well layers in the active layer 25 determine wavelengths of light generated from the active layer. Particularly, it is possible to provide an active layer generating UV light, blue light or green light through adjustment of the composition of the well layers.

The second conductivity type semiconductor layer 27 may be a gallium nitride-based semiconductor layer doped with p-type dopants, for example, Mg. Each of the first conductivity type semiconductor layer 23 and the second conductivity type semiconductor layer 27 may be composed of a single layer or multiple layers and may include super lattice layers, without being limited thereto. The first conductivity type semiconductor layer 23, the active layer 25 and the second conductivity type semiconductor layer 27 may be grown on the substrate within a chamber by any well-known method, such as metal organic chemical vapor deposition (MOCVD) or molecular beam epitaxy (MBE).

The mesa M may have an inclined side surface so as to have a gradually narrowing area with increasing distance from the first conductivity type semiconductor layer 23. The mesa M may have a gentler inclination than the inclined side surface of the substrate 21. However, it should be understood that other implementations are also possible. Alternatively, the inclined side surface of the substrate 21 may have a gentler inclination than the side surface of the mesa M.

The mesa M includes a through-hole 30a formed through the second conductivity type semiconductor layer 27 and the active layer 25 to expose the first conductivity type semiconductor layer 23. The through-hole 30a is surrounded by the second conductivity type semiconductor layer 27 and the active layer 25. The mesa M may have a substantially rectangular shape with cut corners. The mesa M may further include an indented portion 30b exposing the first conductivity type semiconductor layer 23. The indented portion 30b is partially surrounded by the second conductivity type semiconductor layer 27 and the active layer 25. The indented portion 30b may be formed on all four side surfaces of the mesa M, without being limited thereto. Alternatively, the indented portion may be restrictively formed on one to three side surfaces of the mesa. Sidewalls of the through-hole 30a and the indented portion 30b may be inclined like the side surface of the mesa M. The sidewalls of the through-hole and the indented portion may have a gentler inclination than the inclined side surface of the substrate 21.

The ohmic reflection layer 31 is disposed on the mesa M to contact the second conductivity type semiconductor layer 27. The ohmic reflection layer 31 may be disposed over the entire region of an upper surface of the mesa M. For example, the ohmic reflection layer 31 may cover 80% or more, specifically 90% or more, of the upper surface of the mesa M.

The ohmic reflection layer 31 may include a reflective metal layer and thus can reflect light, which is generated in the active layer 25 and reaches the ohmic reflection layer 31, towards the substrate 21. For example, the ohmic reflection layer 31 may be composed of a single reflective metal layer, without being limited thereto. In some exemplary embodiments, the ohmic reflection layer 31 may include an ohmic layer and a reflective layer. The ohmic layer may be a metal layer such as a Ni layer and the reflective layer may be a metal layer having high reflectivity such as an Ag or Al layer. The ohmic reflection layer 31 may further include barrier layers, for example, Ni, Ti, and Au layers. For example, the ohmic reflection layer may have a stack structure of Ni/Ag/Ni/Ti/Ni/Ti/Au/Ti.

The ohmic oxide layer 29 may cover the mesa M around the ohmic reflection layer 31. The ohmic oxide layer 29 may be formed of a transparent oxide layer, for example, indium tin oxide (ITO) or ZnO. A side surface of the ohmic oxide layer 29 may be substantially flush with the side surface of the mesa M. With the ohmic oxide layer 29 disposed around the ohmic reflection layer 31, the light emitting diode can have an enlarged ohmic contact area, thereby reducing forward voltage of the light emitting diode.

The lower insulation layer 33 covers the mesa M, the ohmic oxide layer 29 and the ohmic reflection layer 31. The lower insulation layer 33 may cover the side surface of the mesa M along the periphery of the mesa M and may also cover a portion of the first conductivity type semiconductor layer 23 exposed along the periphery of the mesa M. The lower insulation layer 33 covers the sidewall of the through-hole 30a inside the through-hole 30a and also covers the sidewall of the indented portion 30b.

The lower insulation layer 33 has a first opening 33a which exposes the first conductivity type semiconductor layer 23, and a second opening 33b which exposes the ohmic reflection layer 31. The first opening 33a may be disposed in each of the through-hole 30a and the indented portion 30b. In addition, the lower insulation layer 33 may expose the first conductivity type semiconductor layer 23 along the periphery of the mesa M.

The second opening 33b of the lower insulation layer 33 exposes the ohmic reflection layer 31. The lower insulation layer 33 may include a plurality of second openings 33b, which may be disposed near one side of the mesa M.

The lower insulation layer 33 may be composed of a single layer of $SiO_2$ or $Si_3N_4$, without being limited thereto. Alternatively, the lower insulation layer 33 may have a multilayer structure including, for example, a silicon nitride layer and a silicon oxide layer, or may include a distributed Bragg reflector in which dielectric layers having different indexes of refraction, such as a silicon oxide layer and a titanium oxide layer, are alternately stacked one above another.

The first pad metal layer 35a is disposed on the lower insulation layer 33 and is insulated from the mesa M and the ohmic reflection layer 31 by the lower insulation layer 33. The first pad metal layer 35a contacts the first conductivity type semiconductor layer 23 through the first openings 33a of the lower insulation layer 33. The first pad metal layer 35a may include an outer contact portion contacting the first conductivity type semiconductor layer 23 around the mesa M and an inner contact portion contacting the first conductivity type semiconductor layer 23 inside the through-hole 30a. The outer contact portion of the first pad metal layer 35a may be formed near the indented portion 30b formed on the periphery of the mesa M and may also be formed near four corners of the mesa M. At least one of the inner and outer contact portions may be used and use of both the inner contact portion and the outer contact portion can enhance current spreading performance of the light emitting diode.

The second pad metal layer 35b is disposed on the lower insulation layer 33 to be placed above the mesa M and is electrically connected to the ohmic reflection layer 31 through the second openings 33b of the lower insulation layer 33. The second pad metal layer 35b may be surrounded by the first pad metal layer 35a and a boundary region 35ab may be formed therebetween. The lower insulation layer 33 is exposed to the boundary region 35ab, which is covered by the upper insulation layer 37 described below.

The first pad metal layer 35a and the second pad metal layer 35b may be formed of the same material by the same process. Each of the first and second pad metal layers 35a, 35b may include an ohmic reflection layer such as an Al layer, which may be formed on a bonding layer such as a Ti, Cr or Ni layer. In addition, a protective layer composed of a single layer or a composite layer including Ni, Cr, Au and the like may be formed on the ohmic reflection layer. The first and second pad metal layers 35a, 35b may have a multilayer structure of, for example, Cr/Al/Ni/Ti/Ni/Ti/Au/Ti.

The upper insulation layer 37 covers the first and second pad metal layers 35a, 35b. In addition, the upper insulation layer 37 may cover the first conductivity type semiconductor layer 23 along the periphery of the mesa M. Here, the upper insulation layer 37 may expose the first conductivity type semiconductor layer 23 along an edge of the substrate 21.

The upper insulation layer 37 includes a first opening 37a which exposes the first pad metal layer 35a and a second opening 37b which exposes the second pad metal layer 35b. The first opening 37a and the second opening 37b may be disposed above the mesa M so as to face each other. Particularly, the second opening 37b may be disposed only in an upper region of the second pad metal layer 35b.

Although the second opening 37b is illustrated as completely exposing upper regions of the second openings 33b of the lower insulation layer 33 in this exemplary embodiment, the second opening 37b of the upper insulation layer may be spaced apart from the second openings 33b of the lower insulation layer 33 in the lateral direction. That is, the second openings 33b may be disposed outside the second opening 37b and a plurality of second openings 37b may be spaced apart from the second openings 33b in the lateral direction.

The upper insulation layer 37 may be composed of a single layer of $SiO_2$ or $Si_3N_4$, without being limited thereto. Alternatively, the upper insulation layer 37 may have a multilayer structure including, for example, a silicon nitride layer and a silicon oxide layer, or may include a distributed Bragg reflector in which dielectric layers having different indexes of refraction such as a silicon oxide layer and a titanium oxide layer are alternately stacked one above another.

The first bump pad 39a electrically contacts the first pad metal layer 35a exposed through the first opening 37a of the upper insulation layer 37, and the second bump pad 39b electrically contacts the second pad metal layer 35b exposed through the second opening 37b. As shown in FIG. 1 and FIG. 2, the first bump pad 39a and the second bump pad 39b may be disposed only in the first opening 37a and the second opening 37b, respectively, without being limited thereto. Alternatively, the first and second bump pads 39a, 39b may cover the first and second openings 37a, 37b to seal the first and second openings 37a, 37b, respectively.

The first bump pad 39a is electrically connected to the first conductivity type semiconductor layer 23 through the first pad metal layer 35a, and the second bump pad 39b is electrically connected to the second conductivity type semiconductor layer 27 through the second pad metal layer 35b and the ohmic reflection layer 31. The second pad metal layer 35b may be omitted and the second bump pad 39b may be directly connected to the ohmic reflection layer 31.

As shown in FIG. 1, the second bump pad 39b may be placed only in an upper region of the second pad metal layer 35b, without being limited thereto. Alternatively, the second bump pad 39b may partially overlap the first pad metal layer 35a. In this exemplary embodiment, the upper insulation layer 37 is disposed between the first pad metal layer 35a and the second bump pad 39b to insulate the first pad metal layer 35a from the second bump pad 39b.

The light blocking layer 41 covers the side surfaces and upper surface of the substrate 21. The light blocking layer 41 may cover the entirety of the side surfaces of the substrate 21 to block light from being emitted through the side surfaces of the substrate. The light blocking layer 41 covers not only the perpendicular side surface of the substrate 21 but also the inclined side surface thereof. The light blocking layer 41 may also cover the side surface of the first conductivity type semiconductor layer 23.

In addition, the light blocking layer 41 partially covers the upper surface of the substrate 21 along the edge of the substrate 21 such that the upper surface of the substrate 21 can be partially exposed. A region of the substrate 21 exposed through the light blocking layer 41 becomes the light emitting surface 21a. The roughened surface of the substrate 21 described above may be placed only on the light emitting surface 21a.

The light blocking layer 41 may have a rectangular shape defining the light emitting surface 21a, as shown in FIG. 2, without being limited thereto. The light blocking layer 41 can define the light emitting surface 21a in various shapes. For example, the light emitting surface 21a may have a circular shape, other polygonal shapes excluding the rectangular shape, or an elliptical shape.

The light blocking layer 41 is spaced apart from the mesa M in the lateral direction. As shown in an enlarged circle of FIG. 3, the light blocking layer 41 is spaced apart from the first pad metal layer 35a in the lateral direction. Particularly, the light blocking layer 41 may be disposed above the upper surface of the mesa M and thus is placed above the exposed surface of the first conductivity type semiconductor layer 23 around the mesa M. For example, a lower end of the light blocking layer 41 may be flush with the exposed surface of the first conductivity type semiconductor layer 23 or may be placed above the exposed surface of the first conductivity type semiconductor layer 23, as indicated by a dotted line. Accordingly, a portion of the exposed surface of the first conductivity type semiconductor layer 23 around the mesa M may be exposed to the outside between the light blocking layer 41 and the upper insulation layer 37.

The light blocking layer 41 may include a metal reflection layer of Ag or Al and a barrier layer formed of, for example, Ni and/or Ti may be disposed on the metal reflection layer. Further, an anti-oxidation layer such as an Au layer may be disposed on the barrier layer in order to prevent oxidation of the metal reflection layer. Furthermore, a bonding layer such as a Ni layer or a Ti layer may be interposed between the metal reflection layer and the substrate 21 in order to improve bonding characteristics of the metal reflection layer. The light blocking layer 41 may form ohmic contact or Schottky contact with the substrate 21 and the first conductivity type semiconductor layer 23.

The light blocking layer 41 may further include a distributed Bragg reflector in addition to the metal reflection layer or may further include an omnidirectional reflector (ODR) including a transparent oxide layer between the metal reflection layer and the substrate 21.

Since the light blocking layer 41 is spaced apart from the first pad metal layer 35a, the light blocking layer 41 can be prevented from directly contacting (short circuiting) the first pad metal layer 35a, thereby preventing electrical interference by the light blocking layer 41.

In the structure wherein the light blocking layer 41 includes the metal reflection layer which overlaps the first pad metal layer 35a via the upper insulation layer 37 interposed therebetween, the light blocking layer 41 can be directly electrically connected to the first pad metal layer 35a through defects such as pin holes or cracks in the upper insulation layer 37. In this case, electrical characteristics of the light emitting diode, such as forward voltage, can be significantly changed depending upon the presence of contact between the light blocking layer 41 and the first pad metal layer 35a, thereby causing significant variation in electrical characteristics between light emitting diodes. On the contrary, according to this exemplary embodiment, the light blocking layer 41 is spaced apart from the first pad metal layer 35a, thereby enabling mass production of light emitting diodes with less deviation in electrical characteristics.

According to this exemplary embodiment, the light emitting surface 21a is defined on the upper surface of the substrate by the light blocking layer 41, whereby the size of the light emitting surface can be decreased without changing drive current for operation of the light emitting diode 100. As a result, the current density of the light emitting diode does not increase, thereby preventing deterioration in luminous efficacy due to the drooping phenomenon. Furthermore, the light blocking layer 41 is used as a reflection layer, thereby preventing deterioration in light output.

Furthermore, the light emitting diode employs the light blocking layer 41, whereby the size of the light emitting surface can be easily controlled. For example, when the size of the light emitting surface and light output for spot lighting are determined, the size of the light emitting diode is determined corresponding to the light output thereof. In this case, the size of the light emitting diode may be determined so as to allow the light emitting diode to be driven by a current density providing the highest luminous efficacy. Then, the size of the light emitting surface required can be adjusted using the light blocking layer 41. Accordingly, it is possible to provide a light emitting diode that includes the light emitting surface formed in a desired size and can be driven at high current to realize high output without deterioration in luminous efficacy.

Figure 4:
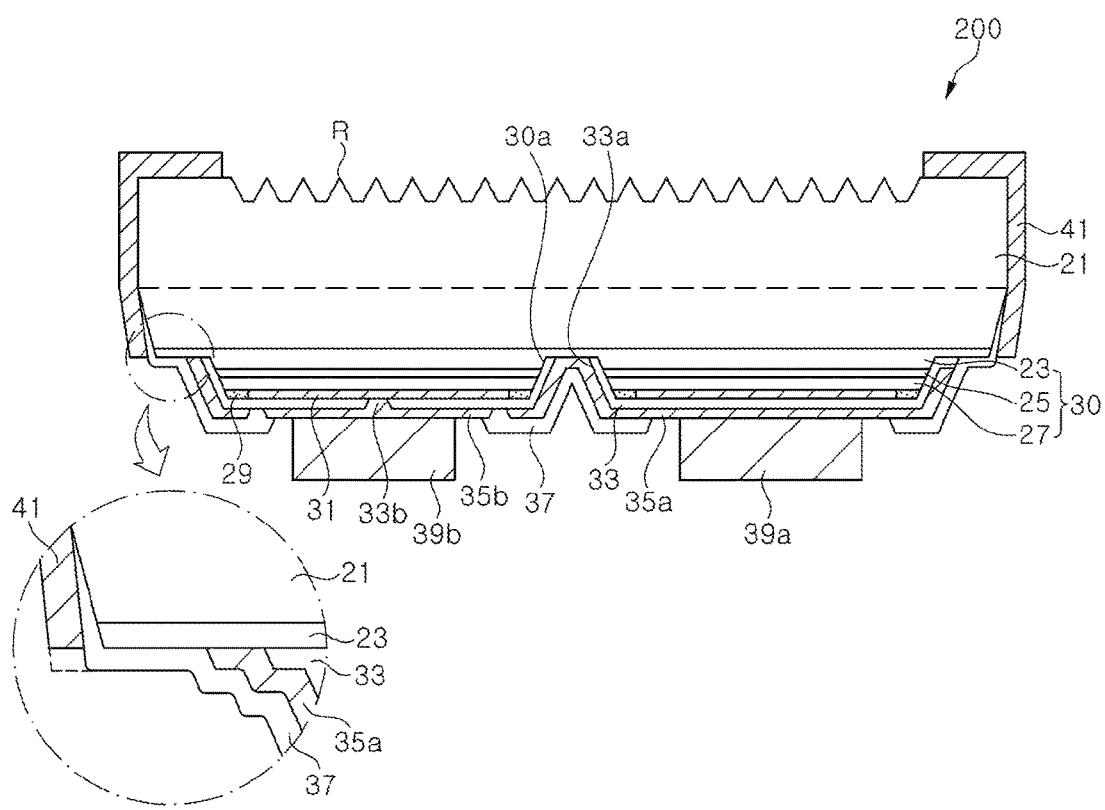
FIG. 4 is a schematic cross-sectional view of a light emitting diode according to an exemplary embodiment.

FIG. 4 is a schematic cross-sectional view of a light emitting diode 200 according to an exemplary embodiment.

Referring to FIG. 4, the light emitting diode 200 according to this exemplary embodiment is generally similar to the light emitting diode 100 described with reference to FIG. 1 to FIG. 3 except that the upper insulation layer 37 covers the inclined side surface of the substrate 21.

That is, the upper insulation layer 37 covers the entirety of the first conductivity type semiconductor layer 23 exposed around the mesa M, and also covers the side surface of the first conductivity type semiconductor layer 23 and the inclined side surface of the substrate 21. Here, the upper insulation layer 37 does not cover the perpendicular side surface of the substrate 21.

The light blocking layer 41 covers the perpendicular side surface of the substrate 21 and also covers the upper insulation layer 37 on the inclined side surface of the substrate. In this structure, the lower end of the light blocking layer 41 may be flush with the exposed surface of the first conductivity type semiconductor layer 23 or may be disposed below the exposed surface of the first conductivity type semiconductor layer 23, as indicated by a dotted line. Here, the lower end of the light blocking layer 41 may be flush with or disposed above a horizontal plane of the upper insulation layer 37.

When the inclined side surface is formed by a scribing process, the inclined side surface can become a rough surface. In this case, the light blocking layer 41 cannot be deposited on the inclined side surface or may be easily removed therefrom even if the side reflection layer can be deposited thereon. Thus, the upper insulation layer 37 is formed to cover the inclined side surface so as to allow stable formation of the light blocking layer 41.

Figure 5:
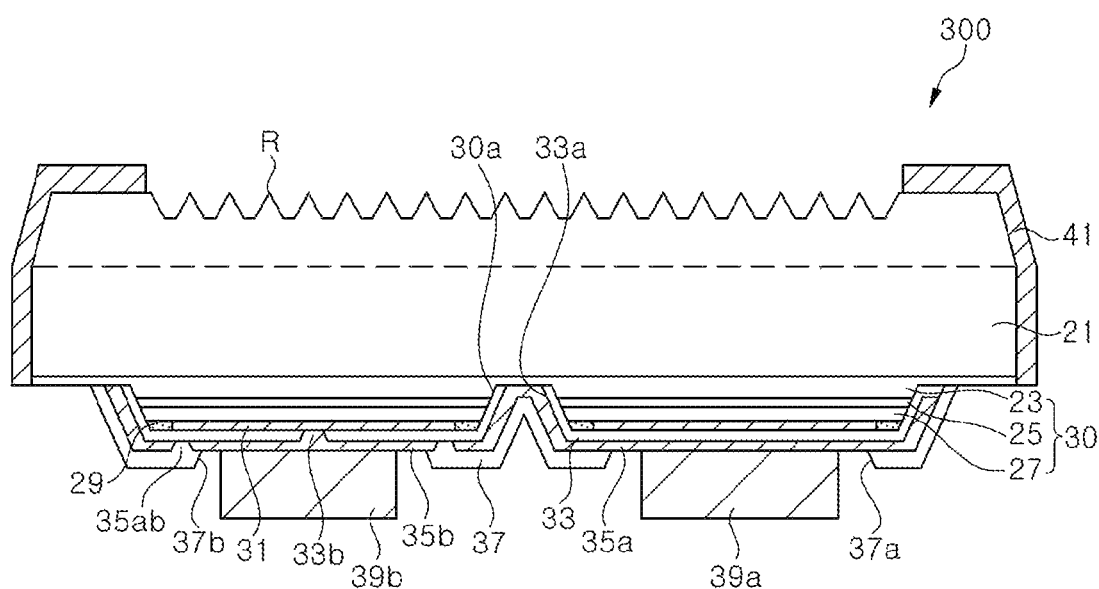
FIG. 5 is a schematic cross-sectional view of a light emitting diode according to an exemplary embodiment.

FIG. 5 is a schematic cross-sectional view of a light emitting diode 300 according to a further exemplary embodiment.

Referring to FIG. 5, the light emitting diode 300 according to this exemplary embodiment is generally similar to the light emitting diode 100 described with reference to FIG. 1 to FIG. 3 except that the inclined side surface of substrate 21 of the light emitting diode 300 is placed closer to the upper surface of the substrate 21 than the perpendicular side surface thereof. The inclined side surface of the substrate may be placed adjacent the upper surface of the substrate 21, and the perpendicular side surface thereof may be placed adjacent the first conductivity type semiconductor layer 23. The perpendicular side surface and the inclined side surface may be covered by the light blocking layer 41.

Since the inclined side surface is placed adjacent the upper surface of the substrate 21, the light emitting diode 300 according to this exemplary embodiment allows more stable formation of the light blocking layer 41 than the light emitting diode 100 shown in FIG. 1 to FIG. 3.

FIG. 6A, FIG. 6B, FIG. 6C, FIG. 6D, FIG. 6E, and FIG. 6F show schematic cross-sectional views of light emitting diodes according to various exemplary embodiments. In the plan views, a hatched portion indicates a light blocking layer 41 and a non-hatched portion indicates a light emitting surface 21a.

Figure 6A:
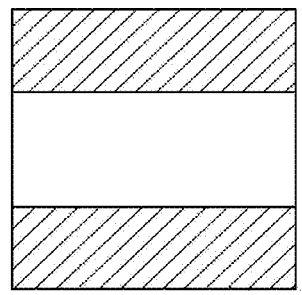
FIG. 6A, FIG. 6B, FIG. 6C, FIG. 6D, FIG. 6E, and FIG. 6F show schematic cross-sectional views of light emitting diodes according to various exemplary embodiments.

Referring to FIG. 6A, the light emitting surface 21a of the light emitting diode according to this exemplary embodiment is generally similar to the light emitting surface 21a of the light emitting diode described with reference to FIG. 2 except that the light emitting surface 21a is continuously formed from one edge of the upper surface of the substrate 21 to the other edge thereof. The light blocking layers 41 are disposed along both edges of the upper surface of the substrate 21 such that the light blocking layer 41 at one side of the substrate is parallel to the light blocking layer 41 at the other side thereof. In this exemplary embodiment, the light emitting surface 21a has a larger width than each of the light blocking layers 41 disposed near both edges of the upper surface of the substrate 21.

Figure 6B:
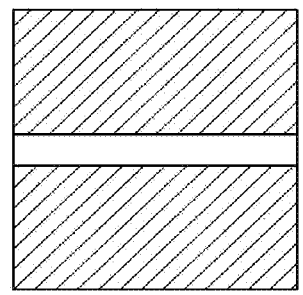

Referring to FIG. 6B, the light emitting surface 21a of the light emitting diode according to this exemplary embodiment is generally similar to the light emitting surface 21a of the light emitting diode described with reference to FIG. 6A except that the light emitting surface 21a has a smaller width than each light blocking layer 41 on the upper surface of the substrate 21. That is, in this exemplary embodiment, the light emitting surface 21a is formed in a relatively narrow linewidth to intersect a central region of the upper surface of the substrate 21, thereby providing elongated light emission.

Figure 6C:
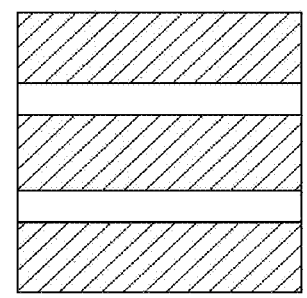

Referring to FIG. 6C, the light emitting surface 21a of the light emitting diode according to this exemplary embodiment is generally similar to the light emitting surface 21a of the light emitting diode described with reference to FIG. 6B except that the light emitting surface 21a is divided into two regions. Each of the divided regions of the light emitting surface may have a smaller width than each light blocking layer 41 on the upper surface of the substrate 21. In addition, the central region of the upper surface of the substrate 21 may be covered by the light blocking layer 41 and the divided regions of the light emitting surface may be parallel to each other. Although the light emitting surface 21a is divided into two regions in FIG. 6C, the light emitting surface 21a may be divided into three or more regions.

Figure 6D:
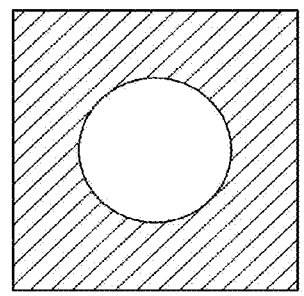

Referring to FIG. 6D, in this exemplary embodiment, the light emitting surface 21a has a circular shape. Alternatively, the light emitting surface may have an elliptical shape or a polygonal shape with round corners, as described above.

Figure 6E:
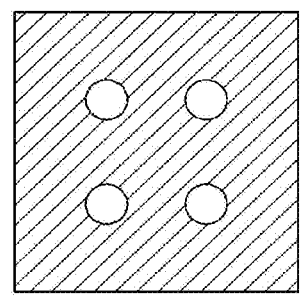

Referring to FIG. 6E, in this exemplary embodiment, the light emitting surface 21a is divided into four regions by the light blocking layer 41. Each of the divided regions of the light emitting surface 21a has an island shape surrounded by the light blocking layer 41. However, it should be understood that other implementations are also possible. Alternatively, the light blocking layer 41 may be divided in an island shape by the light emitting surface 21a.

Each of the divided regions has a circular shape, without being limited thereto. Alternatively, each of the divided regions may have an elliptical shape, a polygonal shape, or a polygonal shape with round corners. In addition, although the light emitting surface 21a is illustrated as being divided into four regions in FIG. 6E, the light emitting surface 21a may be divided into two, three or five or more regions. Further, the divided regions of the light emitting surface 21a may have different shapes or the same shape. With the structure wherein the divided regions of the light emitting surface 21a have the same shape, the light emitting diode can emit spot beams having the same shape, thereby enabling easy control of light emission.

Figure 6F:
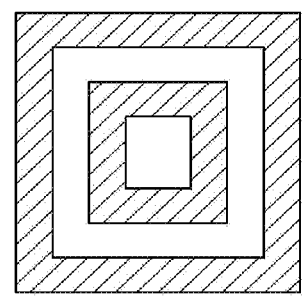

Referring to FIG. 6F, in this exemplary embodiment, one region of the light emitting surface 21a is surrounded by another region of the light emitting surface 21a. The light blocking layer 41 is interposed between the regions of the light emitting surface 21a to separate the regions of the light emitting surface 21a from each other.

One region of the light emitting surface 21a may be disposed in the central region of the upper surface of the substrate 21 and another region of the light emitting surface 21a may be separated at a constant distance from the region of the light emitting surface 21a disposed in the central region of the substrate 21. With this structure, light emitted from the regions of the light emitting surface 21a may have the same central axis as the central axis of the light emitting diode, thereby enabling easy design of a lens suitable for the light emitting diode. Although the light emitting surface 21a is illustrated as having a rectangular shape in FIG. 6F, the light emitting surface 21a may have a circular shape, an elliptical shape, or other polygonal shapes.

FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 15C, and FIG. 15D are schematic plan views and cross-sectional views illustrating a method of manufacturing a light emitting diode according to an exemplary embodiment. FIGS. 7A, 8A, 9A, 10A, 11A, 12A, 13A, and 14A are plan views and FIGS. 7B, 8B, 9B, 10B, 11B, 12B, 13B, and 14B are cross-sectional views taken along line A-A thereof.

Figure 7A:
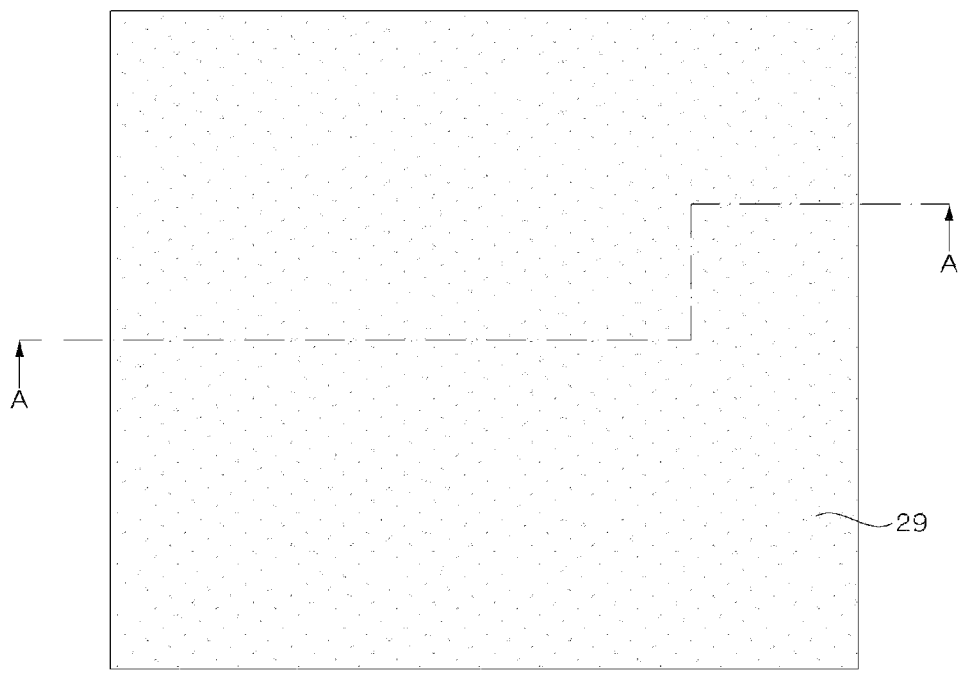
FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, FIG. 15A, FIG. 15B, FIG. 15C, and FIG. 15D are schematic plan views and cross-sectional views illustrating a method of manufacturing a light emitting diode according to an exemplary embodiment.
Figure 7B:
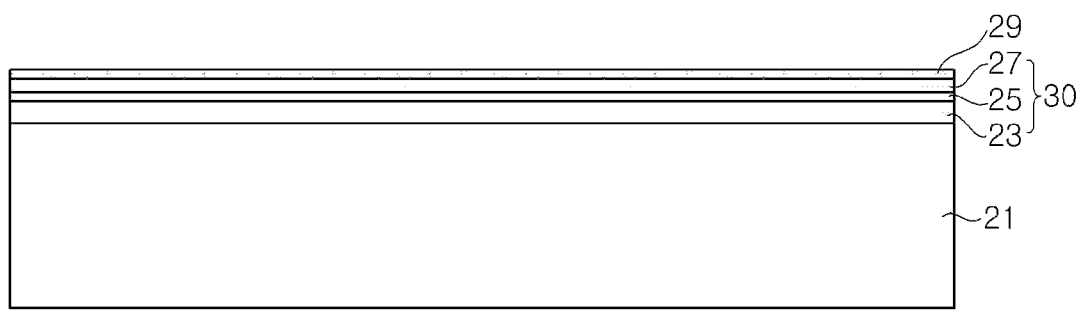

First, referring to FIG. 7A and FIG. 7B, a semiconductor stack 30 including a first conductivity type semiconductor layer 23, an active layer 25 and a second conductivity type semiconductor layer 27 is grown on a substrate 21 and an ohmic oxide layer 29 is formed on the semiconductor stack 30.

The substrate 21 may be a sapphire substrate or a gallium nitride-based substrate. The gallium nitride-based semiconductor layer may have an n-type dopant concentration of, for example, $7E17/cm^3$ to $9E17/cm^3$. The first conductivity type semiconductor layer 23 may have an n-type dopant concentration of, for example, $9E18/cm^3$ to $2E19/cm^3$.

The first conductivity type semiconductor layer 23, the active layer 25 and the second conductivity type semiconductor layer 27 may be grown on the substrate 21 within a chamber by any well-known method, such as metal organic chemical vapor deposition (MOCVD) or molecular beam epitaxy (MBE).

The ohmic oxide layer 29 may be formed of, for example, ITO or ZnO. The ohmic oxide layer 29 may be formed by e-beam evaporation or sputtering and may cover the second conductivity type semiconductor layer 27 to form ohmic contact with the second conductivity type semiconductor layer 27.

Figure 8A:
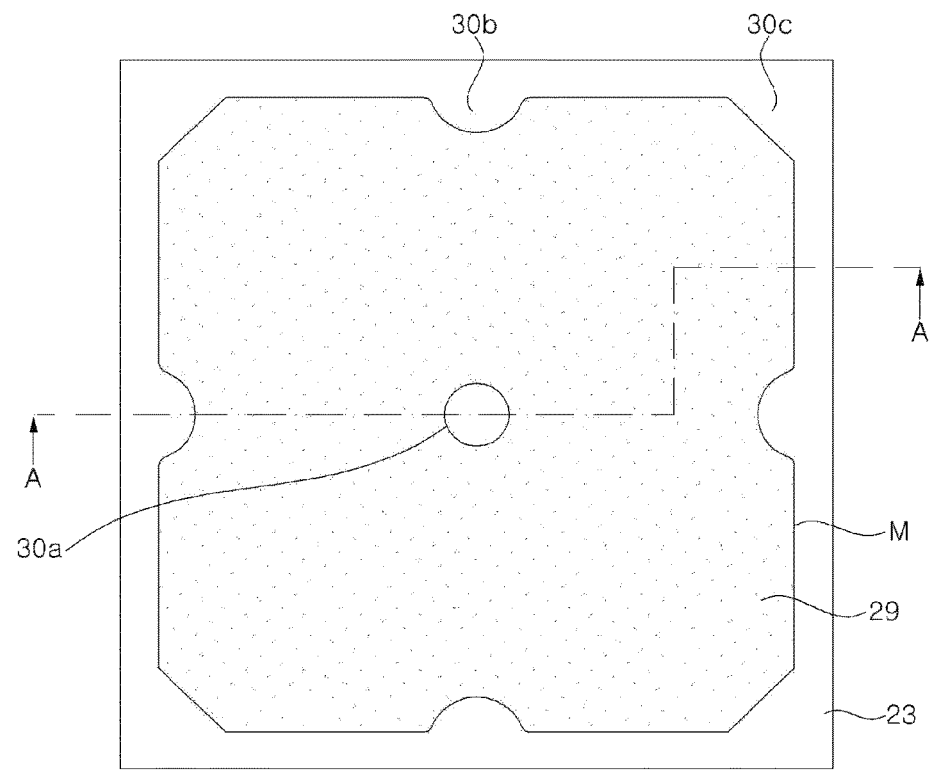
Figure 8B:
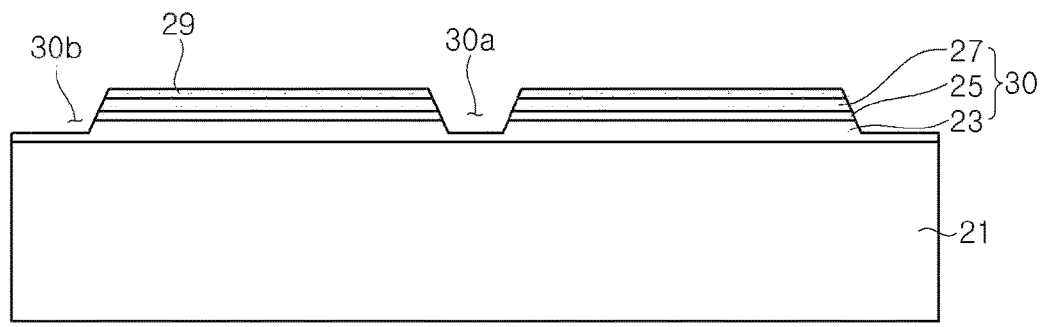

Referring to FIG. 8A and FIG. 8B, a mesa M is formed by patterning the ohmic oxide layer 29 and the semiconductor stack 30. By forming the mesa M, the first conductivity type semiconductor layer 23 is exposed around the mesa M. The mesa M has a through-hole 30a and an indented portion 30b and may be formed to have partially cut corners. The ohmic oxide layer 29 covers substantially the entire upper region of the mesa M and has the same shape as the mesa M in plan view.

In this exemplary embodiment, the ohmic oxide layer 29 may be subjected to patterning by wet etching using a photoresist layer, and the semiconductor stack 30 may be subjected to patterning by dry etching. However, it should be understood that other implementations are also possible and both the ohmic oxide layer 29 and the semiconductor stack 30 may be subjected to patterning through dry etching. On the other hand, patterning of the ohmic oxide layer 29 and the semiconductor stack 30 may be performed using the same photoresist layer.

Figure 9A:
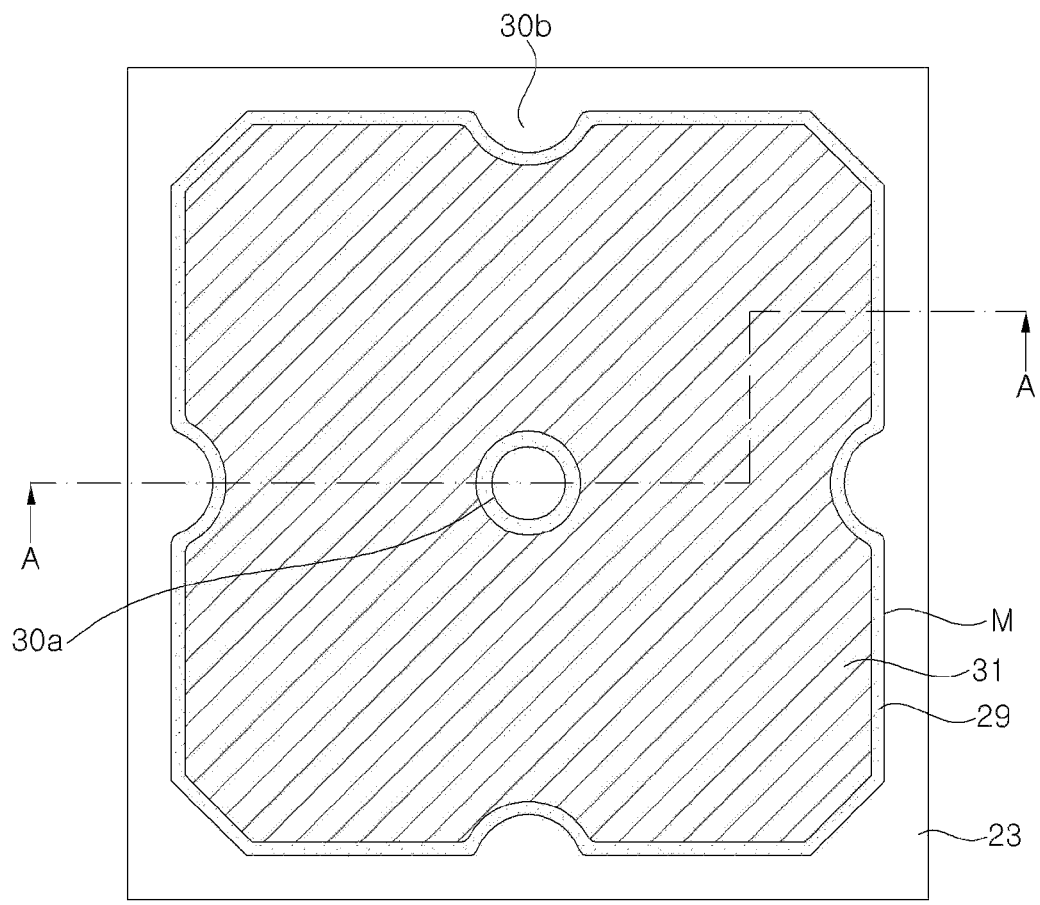
Figure 9B:
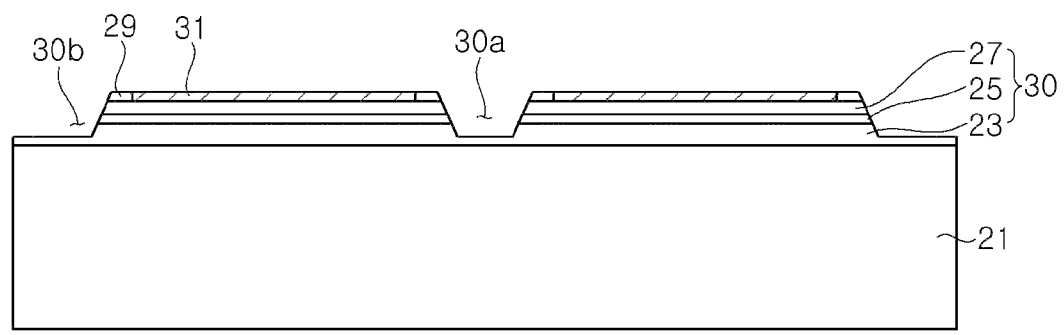

Referring to FIG. 9A and FIG. 9B, the second conductivity type semiconductor layer 27 is exposed by patterning the ohmic oxide layer 29 and an ohmic reflection layer 31 is formed on an exposed region of the second conductivity type semiconductor layer 27. The ohmic reflection layer 31 includes a metal reflection layer such as an Ag or Al layer and may further include an ohmic metal layer such as a Ni layer. Materials for the ohmic reflection layer 31 are described above with reference to FIG. 1 to FIG. 3 and detailed description thereof will be omitted for clarity. The ohmic reflection layer 31 may be formed by e-beam evaporation or sputtering.

Figure 10A:
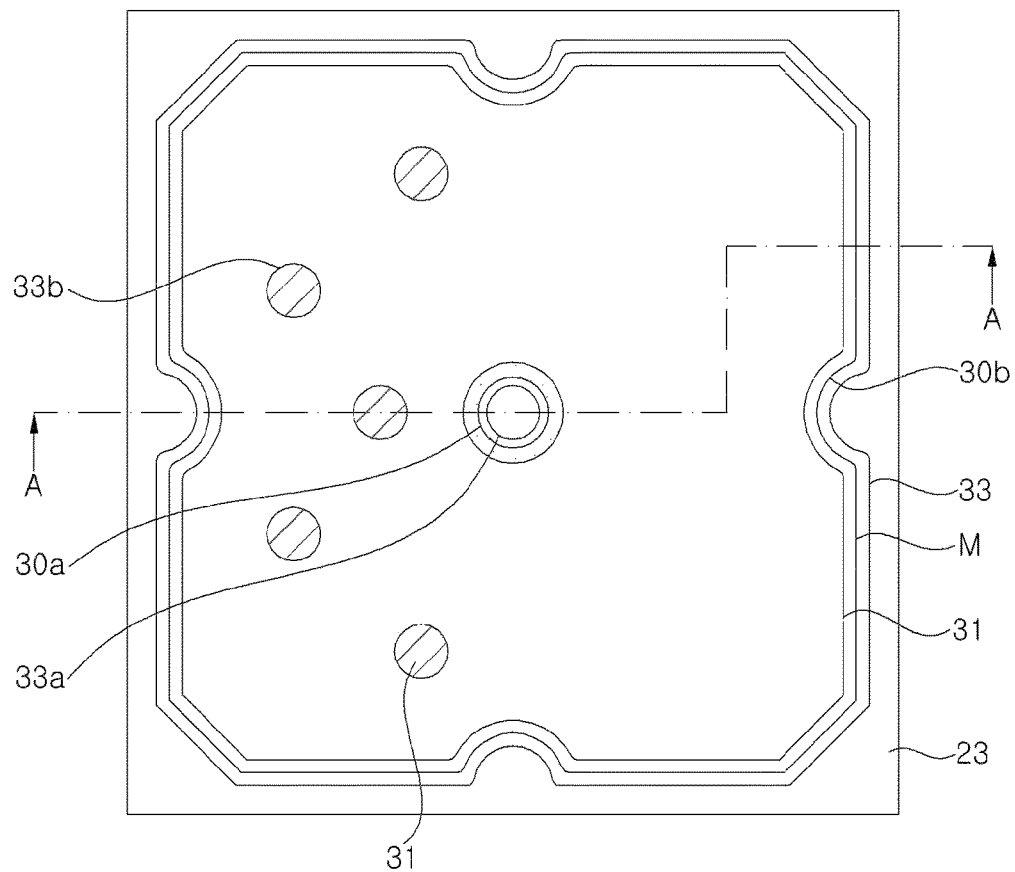
Figure 10B:
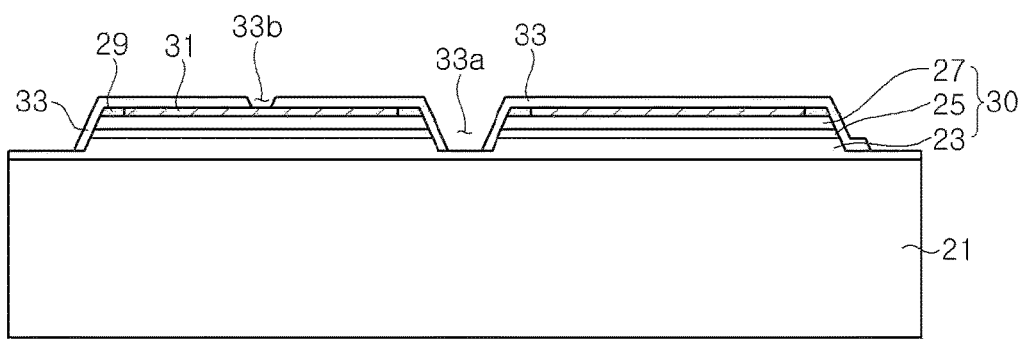

Referring to FIG. 10A and FIG. 10B, a lower insulation layer 33 is formed to cover the ohmic oxide layer 29 and the ohmic reflection layer 31. The lower insulation layer 33 also covers side surfaces of the mesa M and a sidewall of the through-hole 30a. On the other hand, the lower insulation layer 33 has first openings 33a which expose the first conductivity type semiconductor layer 23 and second openings 33b which expose the ohmic reflection layer 31.

For example, the first openings 33a may be formed inside the through-hole 30a and near the indented portion 30b. Furthermore, the lower insulation layer 33 may cover a portion of the first conductivity type semiconductor layer 23 along the periphery of the mesa M. With this structure, the first conductivity type semiconductor layer 23 may be partially exposed along the periphery of the mesa M.

The second openings 33b are placed on the ohmic reflection layer 31 above the mesa M. A plurality of second openings 33b may be arranged to be biased to one side of the mesa M. The ohmic reflection layer 31 is exposed through the second openings 33b. Although the lower insulation layer 33 is shown as having five second openings 33b in this exemplary embodiment, it should be understood that other implementations are also possible. The lower insulation layer 33 may have one second opening 33b or at least two second openings 33b.

Figure 11A:
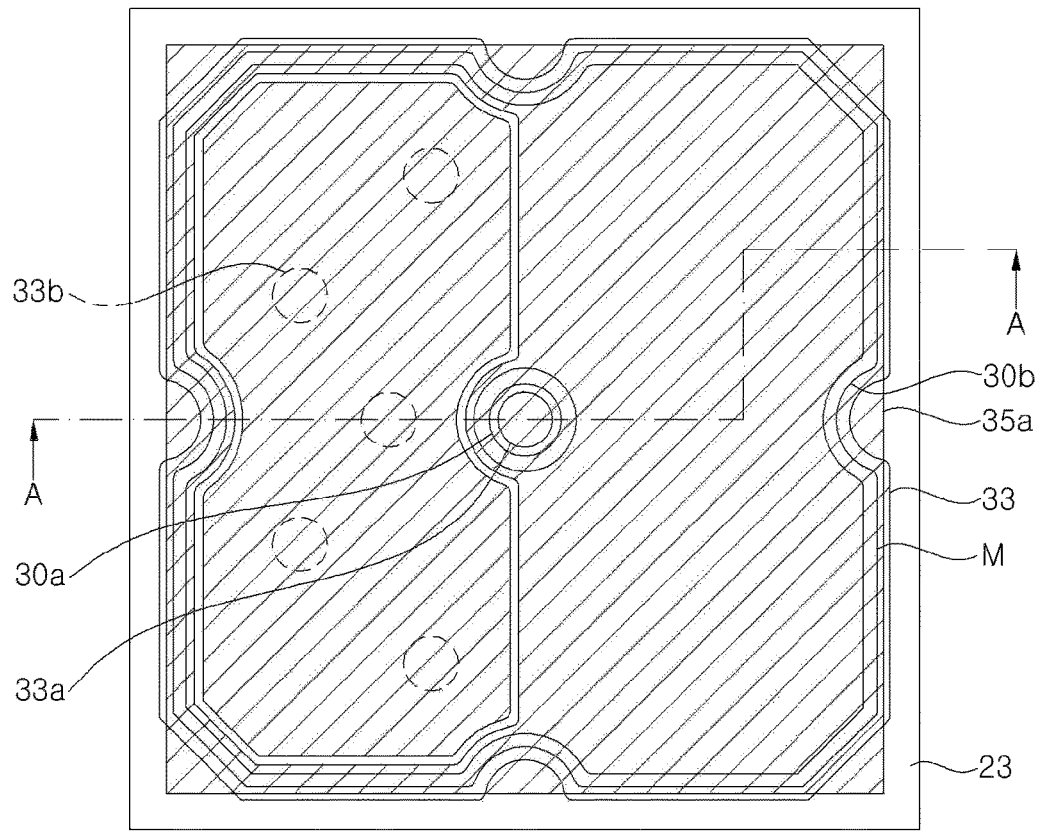
Figure 11B:
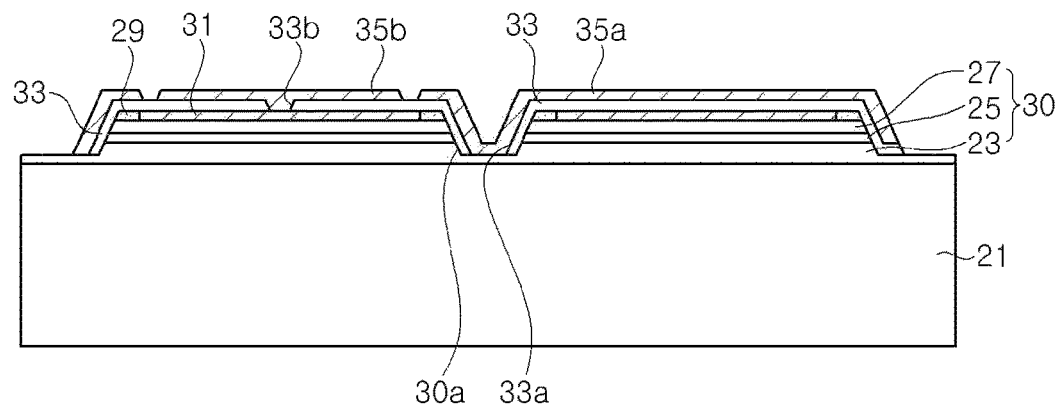

Referring to FIG. 11A and FIG. 11B, a first pad metal layer 35a and a second pad metal layer 35b are formed on the lower insulation layer 33. The first pad metal layer 35a is electrically connected to the first conductivity type semiconductor layer 23 exposed through the first openings 33a and the second pad metal layer 35b is electrically connected to the ohmic reflection layer 31 exposed through the second openings 33b.

The first pad metal layer 35a may be connected to the first conductivity type semiconductor layer 23 exposed through the first openings 33a formed inside the through-hole 30a and near the indented portion 30b, and may also be connected to the first conductivity type semiconductor layer 23 near the corners of the mesa M. The first pad metal layer 35a may include an inner contact portion contacting the first conductivity type semiconductor layer 23 through the through-hole 30a and outer contact portions contacting the first conductivity type semiconductor layer 23 around the mesa M. The inner and outer contact portions of the first pad metal layer 35a allow electric current to be uniformly spread over the entirety of the mesa M.

The second pad metal layer 35b may be surrounded by the first pad metal layer 35a and a boundary region 35ab may be formed between the first pad metal layer 35a and the second pad metal layer 35b. The second pad metal layer 35b covers the second openings 33b and may be placed only above the mesa M.

The first pad metal layer 35a and the second pad metal layer 35b may be formed of the same material by, for example, a lift-off process and thus may be placed on the same level.

Figure 12A:
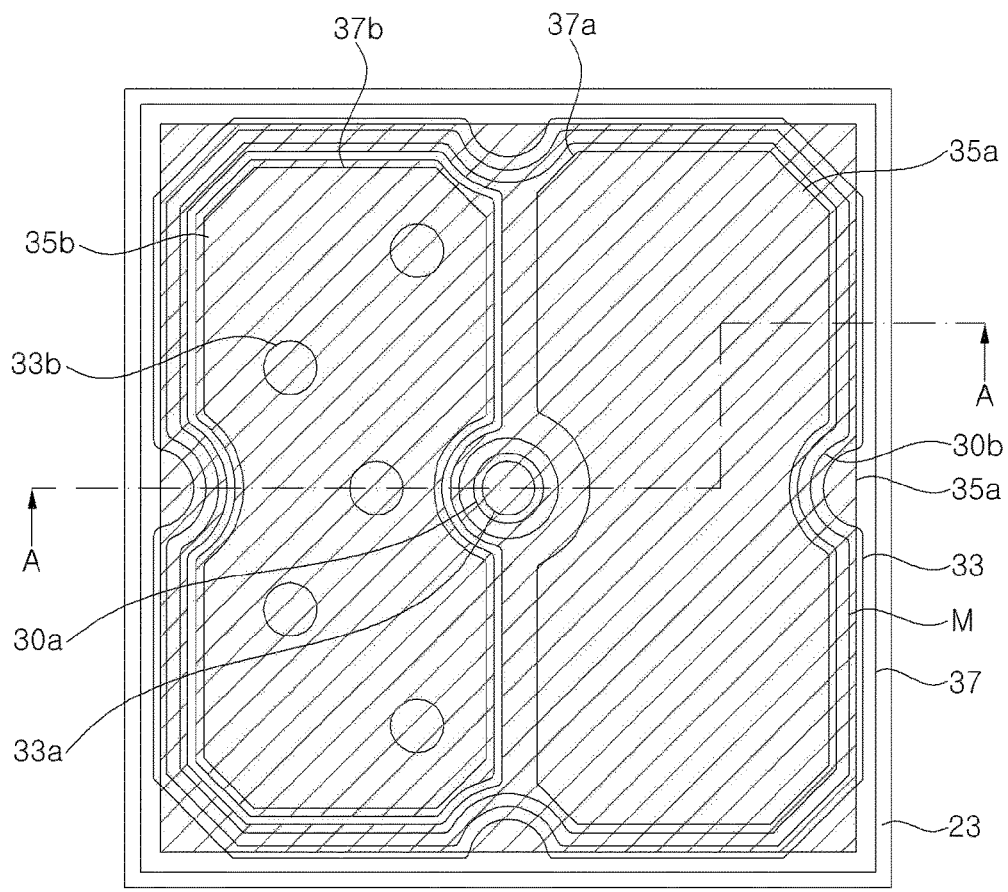
Figure 12B:
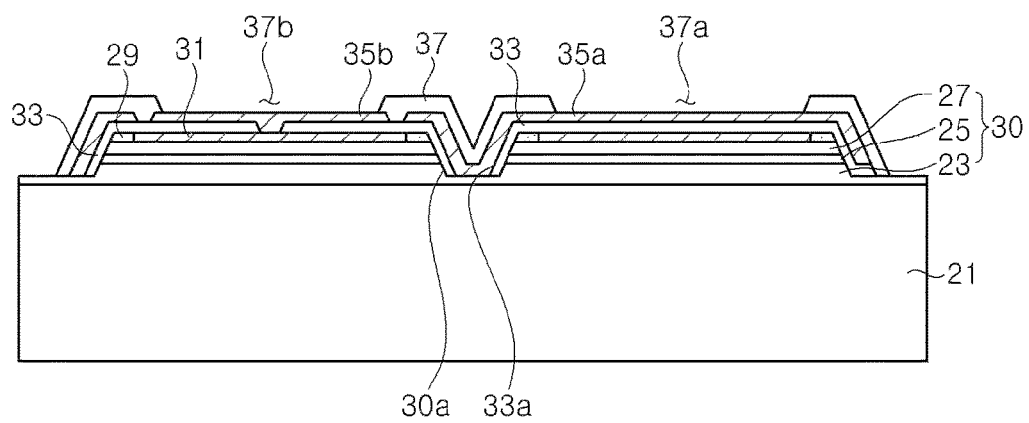

Referring to FIG. 12A and FIG. 12B, an upper insulation layer 37 is formed on the first pad metal layer 35a and the second pad metal layer 35b. The upper insulation layer 37 includes a first opening 37a which exposes the first pad metal layer 35a and a second opening 37b which exposes the second pad metal layer 35b. The upper insulation layer 37 may cover the lower insulation layer 33 around the mesa M and may expose the first conductivity type semiconductor layer 23 along the periphery of the mesa M. The outer contact portions of the first pad metal layer 35a formed near the indented portion 30b and the corners of the mesa M are also covered by the upper insulation layer 37.

The second opening 37b may be placed only in an upper region of the second pad metal layer 35b. The first opening 37a is placed only in an upper region of the first pad metal layer 35a, particularly in an upper region of the mesa M, without being limited thereto. The first opening 37a is spaced apart from the second opening 37b.

Although each of the first opening 37a and the second opening 37b is illustrated as being formed singularly in this exemplary embodiment, the upper insulation layer 37 may have a plurality of first openings 37a and a plurality of second openings 37b.

Furthermore, although the second opening 37b is illustrated as overlapping the second openings 33b of the lower insulation layer 33, the second opening 37b may be formed to be spaced apart from the second openings 33b in the lateral direction so as not to overlap each other.

Figure 13A:
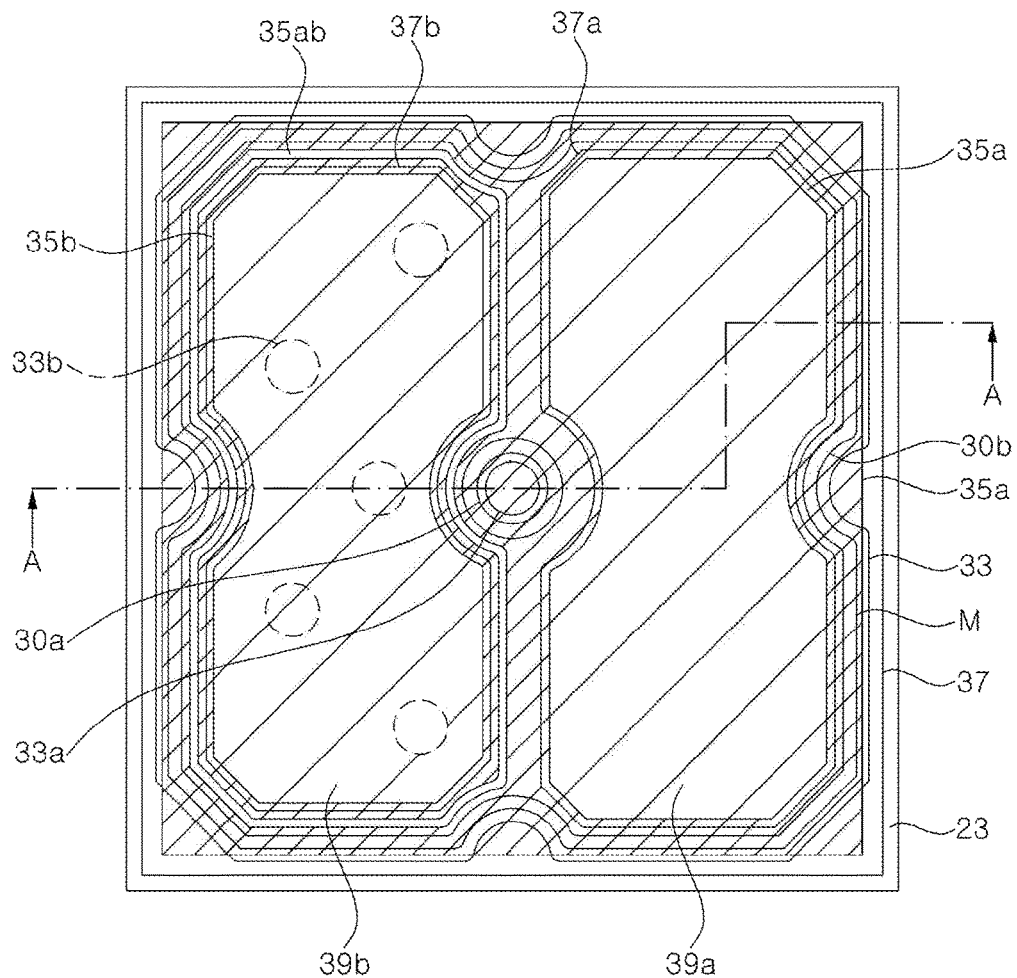
Figure 13B:
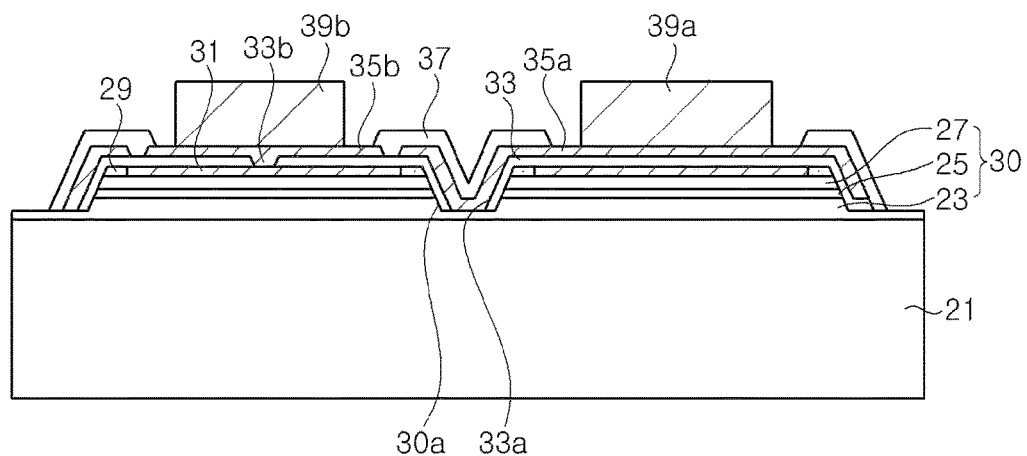

Referring to FIG. 13A and FIG. 13B, a first bump pad 39a and a second bump pad 39b are formed inside the first and second openings 37a, 37b of the upper insulation layer 37, respectively. The first and second bump pads 39a, 39b may be formed of, for example, AuSn, without being limited thereto. The first and second bump pads 39a, 39b are pads bonded to a submount or a lead frame when the light emitting diode is mounted on the submount or the lead frame. The first and second bump pads 39a, 39b may be formed by a well-known process such as a lift-off process.

In this exemplary embodiment, the first and second bump pads 39a, 39b are formed inside the first and second openings 37a, 37b, respectively, but are not limited thereto. Alternatively, the first and second bump pads 39a, 39b may be formed to completely cover the first and second openings 37a, 37b, respectively.

Figure 14A:
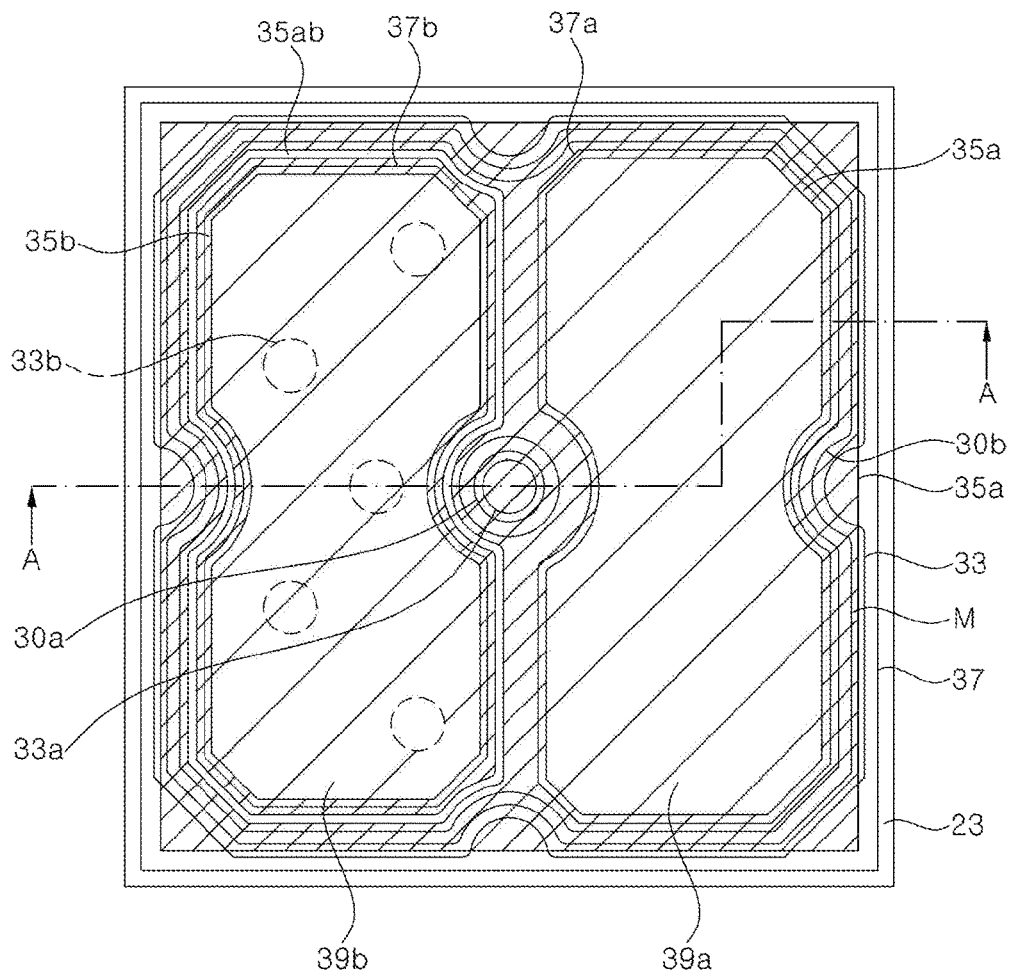
Figure 14B:
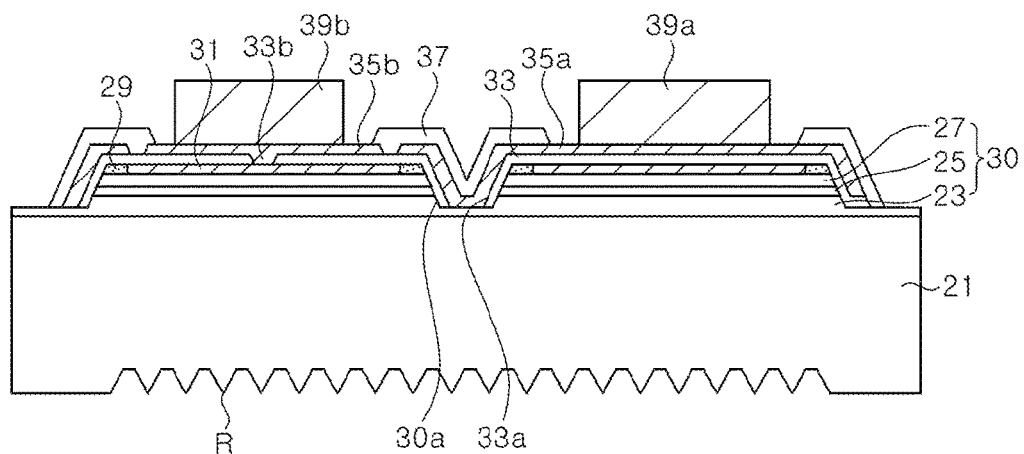

Referring to FIG. 14A and FIG. 14B, after formation of the first and second bump pads 39a, 39b, a lower surface of the substrate 21 is subjected to grinding to reduce the thickness of the substrate 21 and a roughened surface R is formed on the ground lower surface of the substrate 21. The lower surface of the substrate 21 may be ground by lapping and/or polishing and the roughened surface R may be formed by dry and wet etching. The roughened surface R may be formed over the entirety of the lower surface of the substrate 21 or may be formed on a portion of the lower surface thereof, as shown in FIG. 14B. For example, the roughened surface R may be restrictively formed in a region, which will become a light emitting surface 21a, as described above with reference to FIG. 1 to FIG. 3.

Next, referring to FIG. 15A, FIG. 15B, FIG. 15C, and FIG. 15D, a method of forming a light blocking layer 41 on a side surface of the substrate 21 will be described. FIG. 15A, FIG. 15B, FIG. 15C, and FIG. 15D show schematic cross-sectional views illustrating the method of forming the light blocking layer 41 of the light emitting diode 100 according to the exemplary embodiment. Although FIG. 15A, FIG. 15B, FIG. 15C, and FIG. 15D show two light emitting diode regions formed by the processes described with reference to FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, a larger number of light emitting diode regions may be formed on the substrate 21, and the mesa M and the bump pads 39a, 39b may be formed on each of the light emitting diode regions.

Figure 15A:
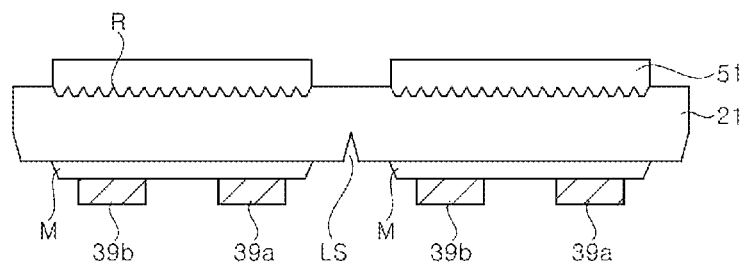

Referring to FIG. 15A, after formation of the first and second bump pads 39a, 39b, a scribing line LS is formed from the first conductivity type semiconductor layer 23 (see FIG. 14B) into the substrate 21. The scribing line LS corresponds to an isolation region between light emitting diodes and thus a plurality of scribing lines LSs may be formed in a mesh shape on the substrate 21. The scribing line LS defines a light emitting diode region having a size set to realize desired light output.

In addition, a photoresist layer 51 is coated onto the substrate 21 having the roughened surface R thereon. The photoresist layer 51 may be formed on the substrate 21 by spin coating or the like. In addition, the photoresist layer 51 is subjected to patterning so as to expose a region above the scribing line LS while covering regions in which light emitting surface regions will be formed. Accordingly, a flat surface of the substrate around the roughened surface R is exposed.

Figure 15B:
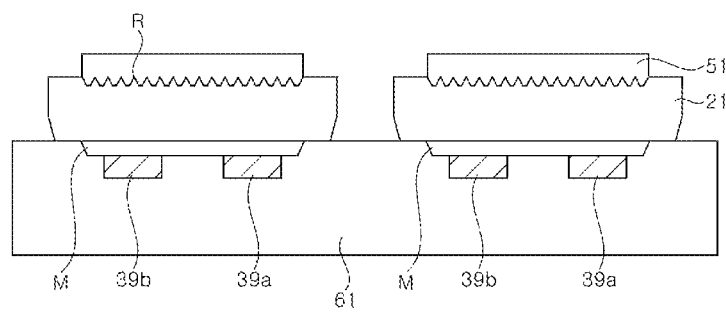

Referring to FIG. 15B, individual light emitting diode regions are divided from each other on a stretchable tape such as a blue tape, which in turn is stretched to separate the individual light emitting diode regions from each other. Thereafter, the divided individual light emitting diode regions are transferred to a support 61 such that the individual light emitting diodes can be attached thereto. For example, the support 61 may be a polymer or polyimide film or another support substrate. The divided individual light emitting diode regions may be individually transferred to a polymer or polyimide film, or may be attached or transferred to the support substrate. Here, the mesa M may be embedded in the support 61 such that the first conductivity type semiconductor layer 23 exposed around the mesa M can adjoin an upper surface of the support 61. However, it should be understood that other implementations are also possible. A contact region between the light emitting diode regions and the support 61 may be adjusted and the first conductivity type semiconductor layer 23 may be partially embedded in the support 61 in the thickness direction.

On the other hand, the side surface of the substrate 21 in each of the individual light emitting diode regions may have an inclined side surface formed by scribing and a perpendicular side surface formed by breaking.

Figure 15C:
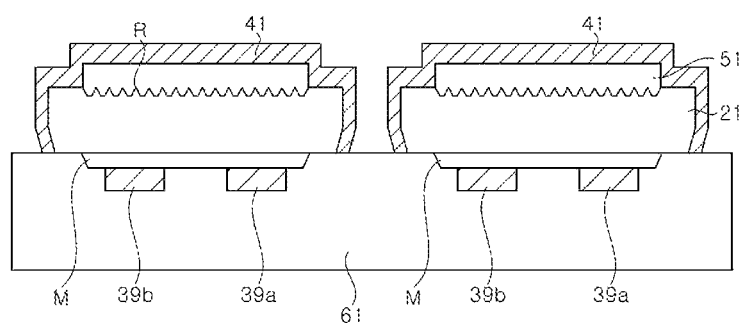

Referring to FIG. 15C, a light blocking layer 41 is deposited on each of the individual light emitting diode regions. The light blocking layer 41 may be deposited thereon by, for example, sputtering. The light blocking layer 41 includes a metal reflection layer such as an Ag layer or an Al layer, or dielectric layers having different indexes of refraction. The light blocking layer 41 is the same as the light blocking layer described with reference to FIG. 1 to FIG. 3 and detailed description thereof will be omitted.

The light blocking layer 41 is formed on the side surface of the substrate 21 to have a substantially uniform thickness on the inclined side surface and the perpendicular side surface. The light blocking layer 41 is deposited on the upper surface of the substrate exposed through the photoresist layer 51 and covers the photoresist layer 51. The light blocking layer 41 formed on the upper surface of the substrate 21 has a larger thickness than the light blocking layer 41 formed on the side surface of the substrate 21.

Since the exposed surface of the first conductivity type semiconductor layer 23 is shielded by the support 61, the light blocking layer 41 is prevented from being formed on the exposed surface of the first conductivity type semiconductor layer 23. Therefore, the light blocking layer 41 can be prevented from overlapping the first pad metal layer 35a with the upper insulation layer 37 interposed therebetween.

Figure 15D:
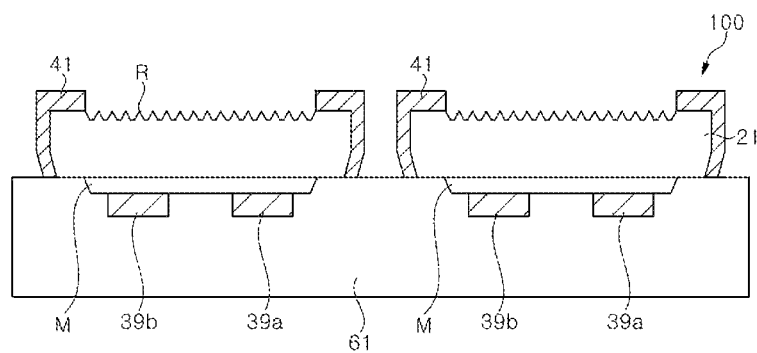

Referring to FIG. 15D, the light blocking layer 41 formed on the photoresist layer 51 can be removed from the upper side of the substrate 21 by removing the photoresist layer 51 and the light emitting diode 100 is completed by removing the support 61 therefrom. As a result, the light emitting diode 100 including the light emitting surface 21a surrounded by the light blocking layer 41 is provided, as shown in FIG. 1 to FIG. 3.

Although the scribing line LS is formed using a laser in this exemplary embodiment, the scribing line LS may be formed using a blade. In this case, the inclined side surface of the substrate 21 may be formed to have a gentler inclination.

In addition, although the scribing line LS is formed after formation of the first and second bump pads 39a, 39b in this exemplary embodiment, the scribing line LS may also be formed before formation of the upper insulation layer 37. In this case, the upper insulation layer 37 may be formed inside the scribing line LS, thereby providing the light emitting diode 200 as shown in FIG. 4.

FIG. 16A, FIG. 16B, FIG. 16C, and FIG. 16D show cross-sectional views illustrating a method of manufacturing a light emitting diode 300 according to a further exemplary embodiment. As described with reference to FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 13A, FIG. 13B, FIG. 14A, FIG. 14B, light emitting diode regions are formed on a substrate 21, and a mesa M and bump pads 39a, 39b are formed on each of the light emitting diode regions.

Figure 16A:
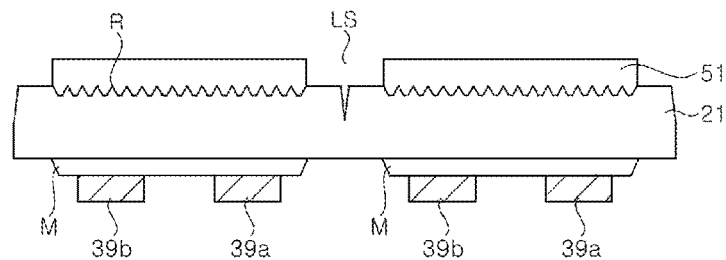
FIG. 16A, FIG. 16B, FIG. 16C, and FIG. 16D are schematic cross-sectional views illustrating a method of manufacturing a light emitting diode according to an exemplary embodiment.

Referring to FIG. 16A, after formation of the first and second bump pads 39a, 39b, for example, a photoresist layer 51 is coated onto the substrate 21 having a roughened surface R thereon. The photoresist layer 51 may be formed on the substrate 21 by spin coating or the like. In addition, the photoresist layer 51 is subjected to patterning so as to expose a region above a scribing line LS while covering regions in which light emitting surface regions will be formed.

Then, the scribing line LS is formed on an upper surface of the substrate 21, that is, from the photoresist layer 51 side into the substrate 21. The scribing line LS corresponds to an isolation region between light emitting diodes and thus a plurality of scribing lines LSs may be formed in a mesh shape on the substrate 21. The scribing line LS may be formed using a laser and chemical treatment such as phosphoric acid treatment may be performed in order to remove debris from the side surface of the substrate 21 while relieving surface roughness of the substrate 21 formed by the laser.

Figure 16B:
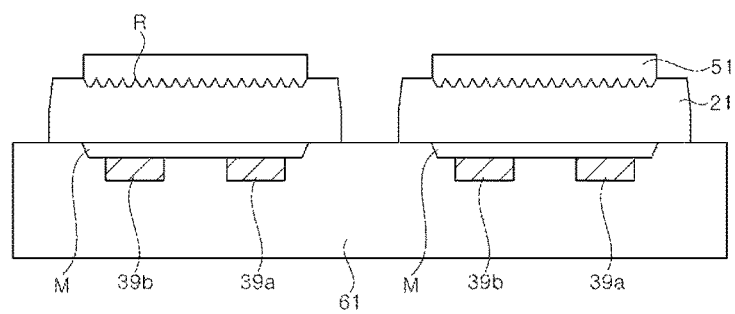

Referring to FIG. 16B, individual light emitting diode regions are divided from each other on a stretchable tape such as a blue tape, which in turn is stretched to separate the individual light emitting diode regions from each other, as described with reference to FIG. 15B. Thereafter, the divided individual light emitting diode regions are transferred to a support 61 such that the individual light emitting diodes can be attached thereto.

On the other hand, the side surface of the substrate 21 in the individual light emitting diode regions may have an inclined side surface formed by scribing and a perpendicular side surface formed by breaking.

Figure 16C:
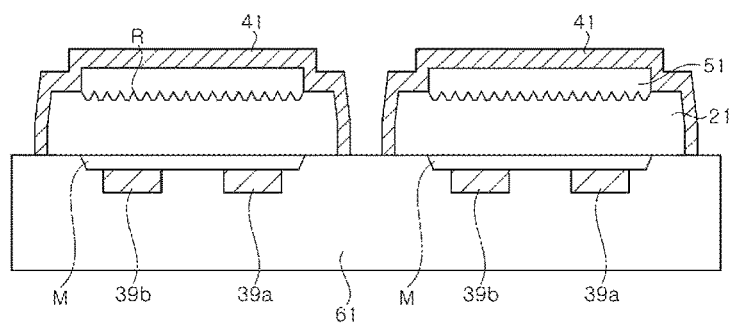

Referring to FIG. 16C, a light blocking layer 41 is deposited on each of the individual light emitting diode regions. The light blocking layer 41 may be deposited thereon by, for example, sputtering. The light blocking layer 41 includes a metal reflection layer such as an Ag layer or an Al layer, or may include a distributed Bragg reflector. The light blocking layer 41 is the same as the light blocking layer 41 described with reference to FIG. 1 to FIG. 3 and detailed description thereof will be omitted.

The light blocking layer 41 is formed on the side surface of the substrate 21 to have a substantially uniform thickness on the inclined side surface and the perpendicular side surface. In addition, the light blocking layer 41 covers the upper surface of the substrate 21 exposed around the photoresist layer 51 while covering the photoresist layer 51.

On the other hand, since the exposed surface of the first conductivity type semiconductor layer 23 is shielded by the support 61, the light blocking layer 41 is prevented from being formed on the exposed surface of the first conductivity type semiconductor layer 23. Therefore, the light blocking layer 41 can be prevented from overlapping the first pad metal layer 35a with the upper insulation layer 37 interposed therebetween.

Figure 16D:
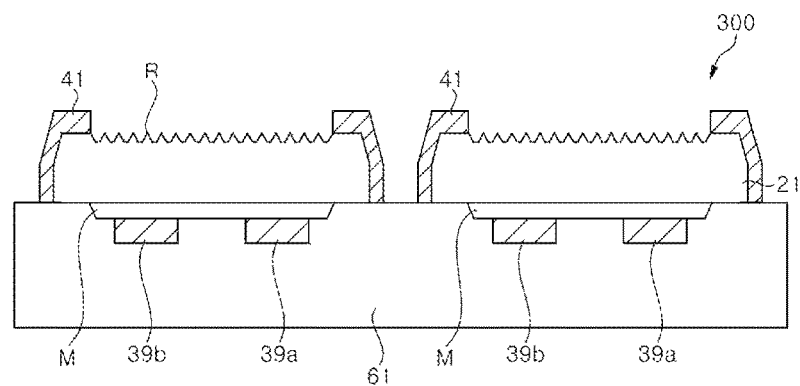

Referring to FIG. 16D, the light blocking layer 41 can be removed by removing the photoresist layer 51. Then, the light emitting diode 300 is completed by removing the support 61 therefrom.

Although the scribing line LS is formed using a laser in this exemplary embodiment, the scribing line LS may be formed using a blade. In this case, the inclined side surface of the substrate 21 may be formed to have a gentler inclination.

Figure 17:
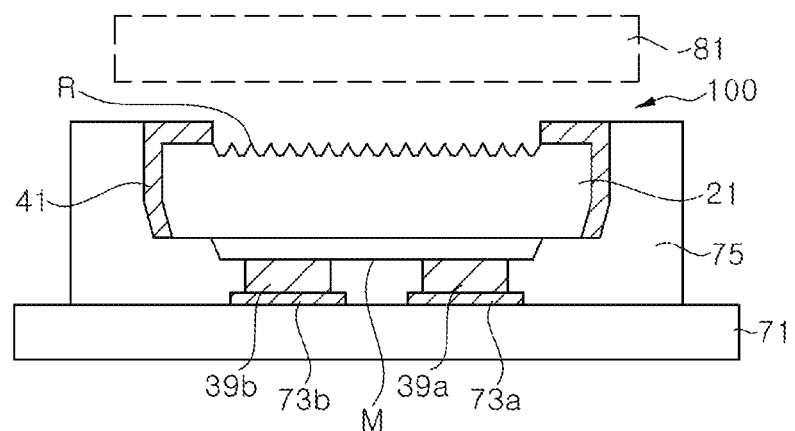
FIG. 17 is a schematic sectional view of a light emitting module according to an exemplary embodiment.

FIG. 17 is a schematic cross-sectional view of a light emitting module according to an exemplary embodiment.

Referring to FIG. 17, the light emitting module includes a support substrate 71, a light emitting diode 100, and a wavelength converter 81. The light emitting module may further include a white barrier layer 75.

The light emitting diode 100 is the same as the light emitting diode described with reference to FIG. 1 to FIG. 3, and is flip bonded onto the support substrate 71, on which the first and second pads 73a, 73b are disposed, via the first and second bump pads 39a, 39b. The support substrate 71 may be, for example, a submount, a printed circuit board, or a lead frame.

The white barrier layer 75 may cover the side surface of the light emitting diode 100. The white barrier layer 75 may be formed by mixing, for example, $TiO_2$ with a silicone resin, an epoxy resin, a silicone molding compound, or an epoxy molding compound. The white barrier layer 75 can have defects such as cracks therein over time. Thus, when the white barrier layer 75 is directly formed on the side surface of the light emitting diode without the light blocking layer 41, light emitted from the light emitting diode can leak through the white barrier layer 75. However, according to this exemplary embodiment, the light blocking layer 41 is formed on the side surface of the light emitting diode, thereby providing a light emitting module that does not suffer from light leakage even after use for a long period of time.

The wavelength converter 81 may be formed on an upper side of the light emitting diode 100. The wavelength converter 81 may be directly formed on the light emitting diode 1000 by mixing phosphors in a resin, or may be formed thereby by attaching a phosphor sheet or a wavelength converting plate to the upper side of the light emitting diode 100. The wavelength converting plate 81 may contain ceramic plate phosphors, particularly, phosphor-in-glass (PIG) or SiC phosphors. With this structure, it is possible to provide a wavelength converter that can be used for a long time by preventing discoloration under high temperature conditions.

The wavelength converting plate 81 may be attached to the light emitting diode 100 using a bonding agent, or may be attached to the white barrier layer 75 or other components. Thus, the wavelength converting plate 81 may be disposed above the light emitting diode 100 to be spaced apart from the light emitting diode 100.

Although this exemplary embodiment is illustrated using the light emitting diode 100 by way of example, other light emitting diodes 200 or 300, 400 may also be used.

Figure 18:
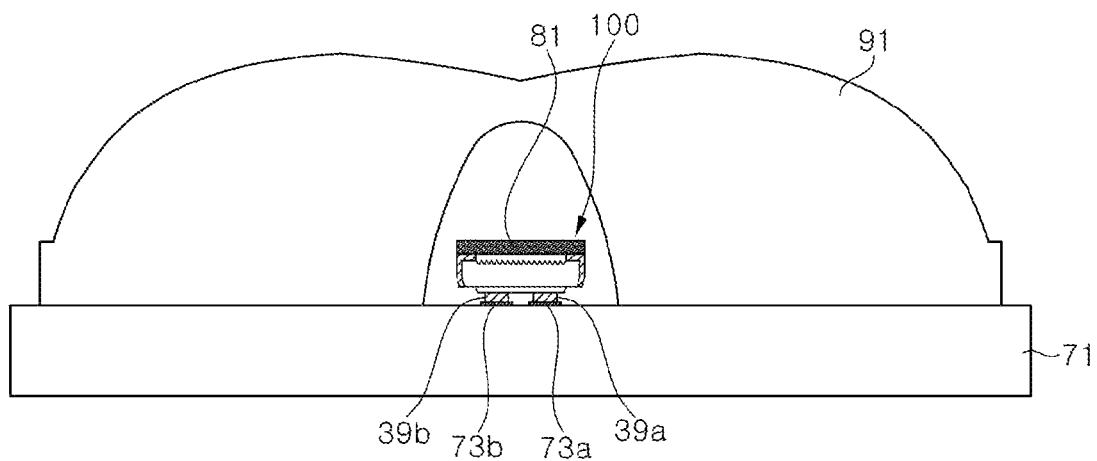
FIG. 18 is a schematic sectional view of a light source module according to an exemplary embodiment.

FIG. 18 is a schematic cross-sectional view of a light source module according to one exemplary embodiment.

Referring to FIG. 18, the light source module includes a support substrate 71, a light emitting diode 100, a wavelength converter 81, and a lens 91. The light emitting diode 100 is the same as the light emitting diode described with reference to FIG. 1 to FIG. 3, and is flip bonded to the support substrate 71, on which the first and second pads 73a, 73b are disposed, via the first and second bump pads 39a, 39b. The support substrate 71 may be, for example, a printed circuit board.

The lens 91 is disposed above the light emitting diode 100. The lens 91 has a lower surface and an upper surface, in which the lower surface includes a concave portion receiving light emitted from the light emitting diode 100 and the upper surface has a light exit surface through which light exits the lens. The concave portion of the lower surface may be surrounded by a flat surface.

In addition, the upper surface of the lens 91 may include a concave portion placed at the center thereof and a convex portion placed around the concave portion. The convex portion may be formed to surround the concave portion.

The lens 91 is a diffusion lens configured to spread light. However, it should be understood that other implementations are also possible. That is, the lens 91 having various shapes may be coupled to the light emitting diode 100 to realize various light patterns.

Although the light emitting diode 100 is flip bonded to the support substrate 71 in the light source module according to this exemplary embodiment, other light emitting diodes 200 or 300 may also be mounted on the support substrate 71.

Although the wavelength converter 81 is illustrated as being disposed on the light emitting diode 100 inside the light emitting module in the above exemplary embodiments, the wavelength converter 81 may be directly attached to the light emitting diode.

Figure 19:
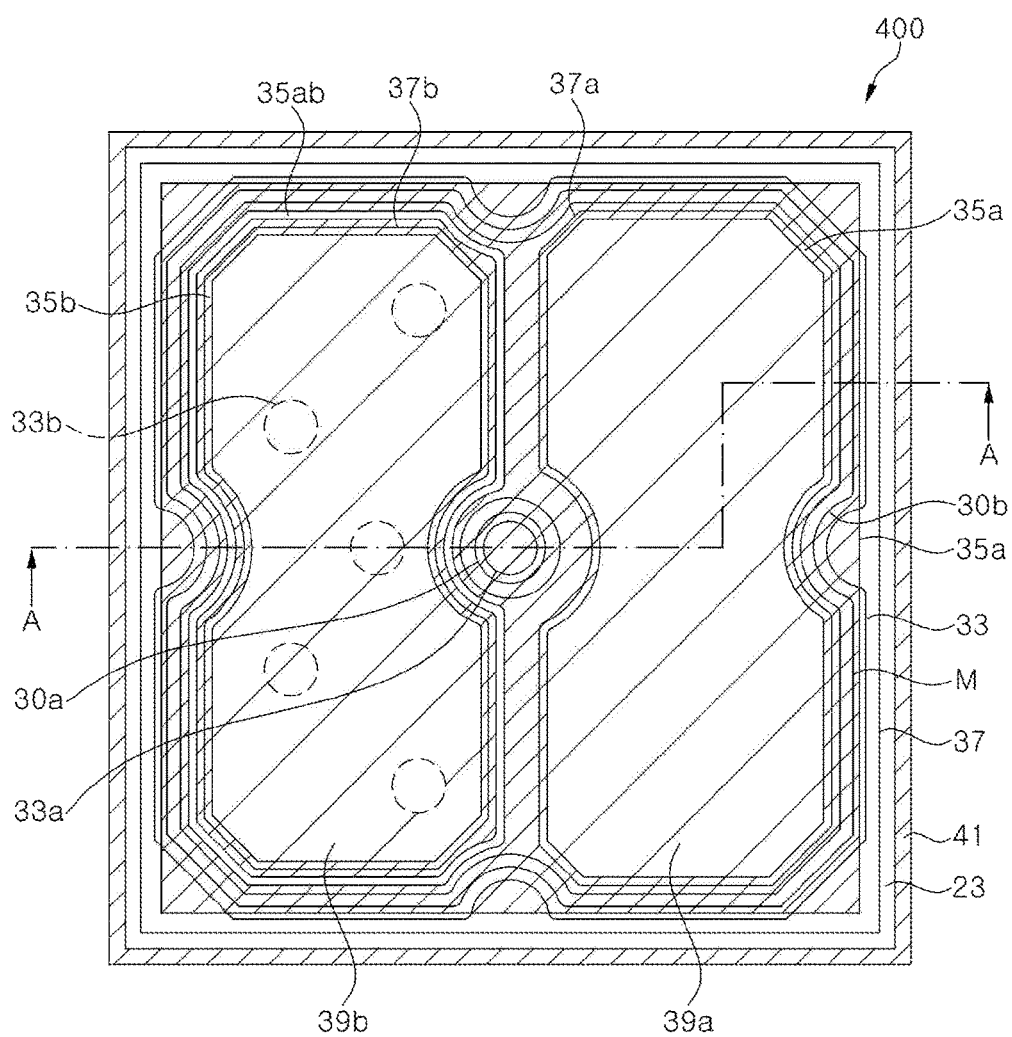
FIG. 19 is a schematic plan view of a light emitting diode according to an exemplary embodiment.
Figure 20:
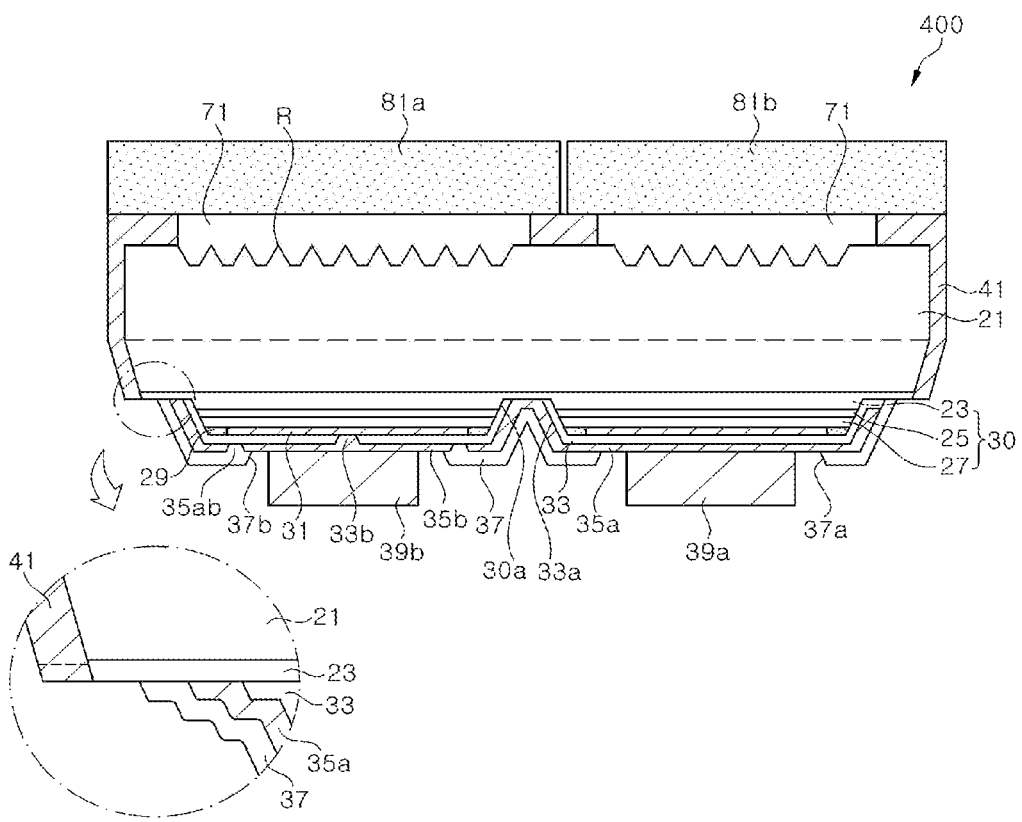
FIG. 20 is a cross-sectional view taken along line A-B of FIG. 19.

FIG. 19 is a schematic plan view of a light emitting diode 400 according to an exemplary embodiment and FIG. 20 is a cross-sectional view taken along line A-A of FIG. 19.

Referring to FIG. 19 and FIG. 20, the light emitting diode 400 includes a substrate 21, a first conductivity type semiconductor layer 23, an active layer 25, a second conductivity type semiconductor layer 27, an ohmic reflection layer 31, a lower insulation layer 33, a first pad metal layer 35a, a second pad metal layer 35b, an upper insulation layer 37, a first bump pad 39a, a second bump pad 39b, and a side reflection layer 41. The light emitting diode 400 further includes a first wavelength converter 81a and a second wavelength converter 81b and may include a bonding agent 171. The first conductivity type semiconductor layer 23, the active layer 25 and the second conductivity type semiconductor layer 27 constitute a semiconductor stack 30. The light emitting diode 400 may further include an ohmic oxide layer 29.

According to this exemplary embodiment, the substrate 21, the first conductivity type semiconductor layer 23, the active layer 25, the second conductivity type semiconductor layer 27, the ohmic reflection layer 31, the lower insulation layer 33, the first pad metal layer 35a, the second pad metal layer 35b, the upper insulation layer 37, the first bump pad 39a, the second bump pad 39b, the semiconductor stack 30 and the transparent ohmic oxide layer 29 are similar to those of the light emitting diode described with reference to FIG. 1 to FIG. 3, and detailed description thereof will be omitted. In addition, a mesa M is disposed on the first conductivity type semiconductor layer 23 and is similar to the mesa M described with reference to FIG. 1 to FIG. 3. Thus, detailed description thereof will also be omitted.

On the other hand, a component described as the light blocking layer 41 is a reflection layer having a reflection function and is referred to as the side reflection layer 41 in this exemplary embodiment. The side reflection layer 41 is disposed on side surfaces of the substrate 21. The side reflection layer 41 covers not only the perpendicular side surface of the substrate 21 but also the inclined side surface thereof. The side reflection layer 41 may also cover the side surface of the first conductivity type semiconductor layer 23. The side reflection layer 41 may be formed to cover all four side surfaces of the substrate 21. However, it should be understood that other implementations are also possible. Alternatively, the side reflection layer 41 may be formed to cover one to three side surfaces of the substrate 21.

As shown in FIG. 20, a portion of the side reflection layer 41 may cover the upper surface of the substrate 21 along an edge of the substrate 21 and may partially cover the upper surface of the substrate 21 such that a region exposing the substrate 21 can be divided into at least two regions.

The portion of the side reflection layer 41 disposed on the upper surface of the substrate 21 may be placed on a flat surface of the substrate 21 and the roughened surface R may be placed only on a region surrounded by the side reflection layer 41.

As shown in an enlarged circle of FIG. 20, the side reflection layer 41 is spaced apart from the first pad metal layer 35*a* in the lateral direction. Particularly, the side reflection layer 41 may be disposed above an upper surface of the mesa M and thus is placed above the exposed surface of the first conductivity type semiconductor layer 23 around the mesa M. For example, a lower end of the side reflection layer 41 may be flush with the exposed surface of the first conductivity type semiconductor layer 23 or may be placed above the exposed surface of the first conductivity type semiconductor layer 23, as indicated by a dotted line. Accordingly, a portion of the exposed surface of the first conductivity type semiconductor layer 23 around the mesa M may be exposed to the outside between the side reflection layer 41 and the upper insulation layer 37.

The side reflection layer 41 may include a metal reflection layer of Ag or Al and a barrier layer formed of, for example, Ni and/or Ti may be disposed on the metal reflection layer. Further, an anti-oxidation layer such as an Au layer may be disposed on the barrier layer in order to prevent oxidation of the metal reflection layer. Furthermore, a bonding layer such as a Ni layer or a Ti layer may be interposed between the metal reflection layer and the substrate 21 in order to improve bonding characteristics of the metal reflection layer. The side reflection layer 41 may form ohmic contact or Schottky contact with the substrate 21 and the first conductivity type semiconductor layer 23.

The side reflection layer 41 may further include a distributed Bragg reflector in addition to the metal reflection layer or may further include an omnidirectional reflector (ODR) including a transparent oxide layer between the metal reflection layer and the substrate 21.

With the side reflection layer 41 disposed only on the side surfaces of the substrate 21 and the first conductivity type semiconductor layer 23 instead of extending to the lower surface of the substrate 21, the side reflection layer 41 can be prevented from directly contacting (short circuiting) the first pad metal layer 35*a*, thereby preventing electrical interference by the side reflection layer 41.

When the side reflection layer 41 includes the metal reflection layer overlapping the first pad metal layer 35*a*, the side reflection layer 41 can be directly electrically connected to the first pad metal layer 35*a* through defects such as pin holes or cracks in the upper insulation layer 37. In this case, electrical characteristics of the light emitting diode, such as forward voltage, can be significantly changed depending upon the presence of contact between the side reflection layer 41 and the first pad metal layer 35*a*, thereby causing significant variation in electrical characteristics between light emitting diodes. On the contrary, according to this exemplary embodiment, the side reflection layer 41 is spaced apart from the first pad metal layer 35*a*, thereby enabling mass production of light emitting diodes with less deviation in electrical characteristics.

The first wavelength converter 81*a* and the second wavelength converter 81*b* are disposed above the substrate 21. The first and second wavelength converters 81*a*, 81*b* may be attached to the substrate via the bonding agent 171, or may be bonded to the side reflection layer 41 formed on the upper surface of the substrate 21.

The first and second wavelength converters 81*a*, 81*b* may include a phosphor-containing wavelength conversion sheet or ceramic plate phosphors (ceramic plate phosphor), particularly, phosphor-in-glass (PIG) or SiC phosphors. Particularly, the ceramic plate phosphor does not suffer from discoloration under high temperature conditions and thus can be used for a long time.

The plural wavelength converters 81*a*, 81*b* may include different kinds of phosphors. For example, the wavelength converter 81*a* may include phosphors that emit green light through wavelength conversion of light generated from the active layer 25, and the wavelength converter 81*b* may include phosphors that emit red light through wavelength conversion of the light generated from the active layer 25. With the active layer 25 configured to emit blue light, the light emitting diode can emit white light through combination of light generated from the active layer 25 and light subjected to wavelength conversion by the wavelength converters 81*a*, 81*b*.

Although the light emitting diode includes two wavelength converters 81*a*, 81*b* in this exemplary embodiment, a larger number of wavelength converters may be provided to the light emitting diode. For example, the light emitting diode may further include a wavelength converter containing blue phosphors. In this light emitting diode, the active layer 25 is configured to emit UV light and white light can be realized through combination of light subjected to wavelength conversion by the wavelength converters.

Although this exemplary embodiment provides the light emitting diode 400 configured to emit white light, it should be understood that other implementations are also possible and a mixed color can be realized using the plurality of wavelength converters 81*a*, 81*b*.

Figure 21:
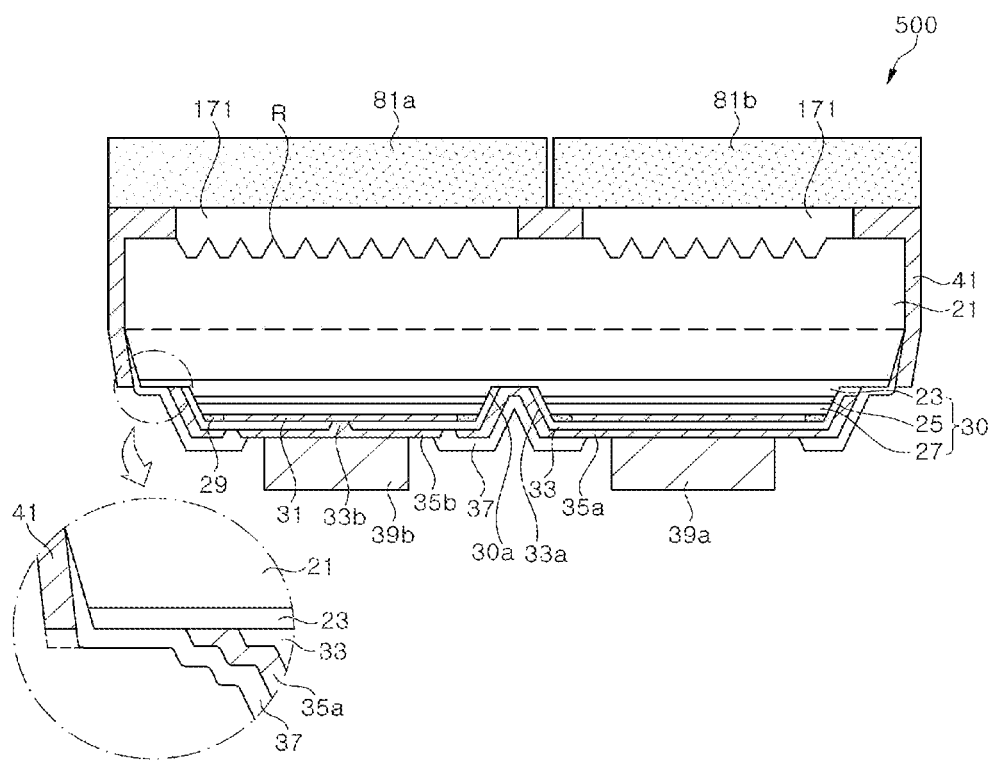
FIG. 21 is a schematic plan view of a light emitting diode according to an exemplary embodiment.

FIG. 21 is a schematic plan view of a light emitting diode 500 according to yet another exemplary embodiment.

Referring to FIG. 21, the light emitting diode 500 according to this exemplary embodiment is generally similar to the light emitting diode 400 described with reference to FIG. 19 and FIG. 20 except the upper insulation layer 37 covers the inclined side surface of the substrate 21.

That is, the upper insulation layer 37 covers the entirety of the first conductivity type semiconductor layer 23 exposed around the mesa M, and also covers the side surface of the first conductivity type semiconductor layer 23 and the inclined side surface of the substrate 21. Here, the upper insulation layer 37 does not cover the perpendicular side surface of the substrate 21.

On the other hand, the side reflection layer 41 covers the perpendicular side surface of the substrate 21 and also covers the upper insulation layer 37 on the inclined side surface. In this structure, a lower end of the side reflection layer 41 may be flush with the exposed surface of the first conductivity type semiconductor layer 23 or may be disposed below the exposed surface of the first conductivity type semiconductor layer 23, as indicated by a dotted line. Here, the lower end of the side reflection layer 41 may be flush with or disposed above a horizontal plane of the upper insulation layer 37.

Figure 22A:
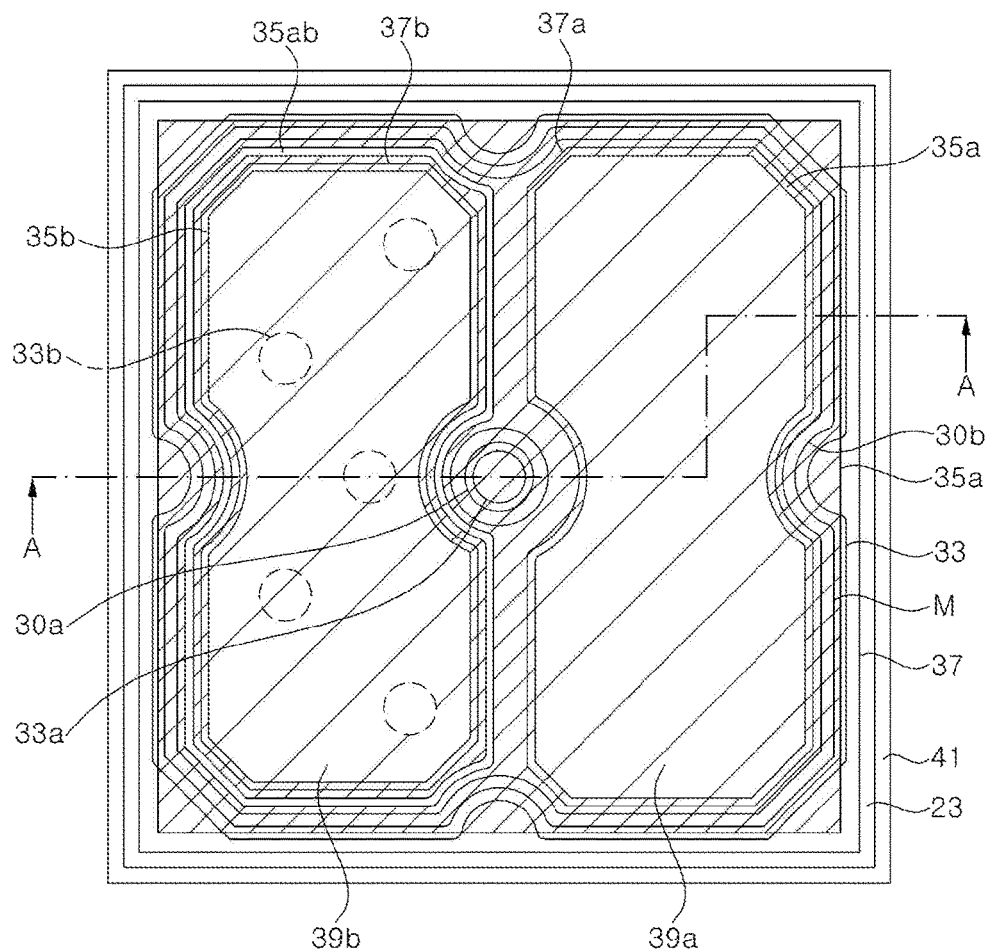
FIG. 22A, FIG. 22B, FIG. 23A, FIG. 23B, FIG. 23C, FIG. 23D, and FIG. 23E are schematic views illustrating a method of manufacturing a light emitting diode according to an exemplary embodiment.
Figure 22B:
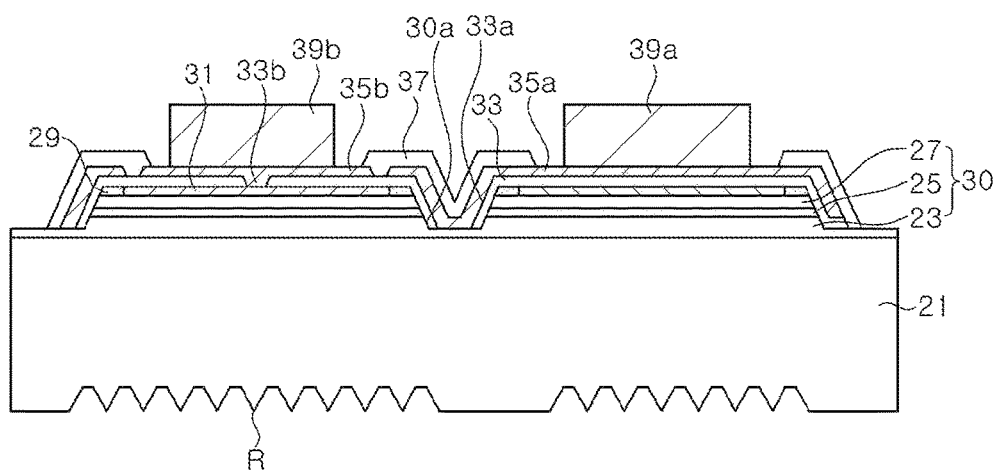

FIG. 22A, FIG. 22B, FIG. 23A, FIG. 23C, FIG. 23D, and FIG. 23E are schematic views illustrating a method of manufacturing a light emitting diode according to an exemplary embodiment. FIG. 22A is a plan view and FIG. 22B, FIG. 23A, FIG. 23C, FIG. 23D, and FIG. 23E are cross-sectional views illustrating a method of manufacturing a light emitting diode 400 according to yet another exemplary embodiment. FIG. 22B is a cross-sectional view taken along line A-A of FIG. 22A.

The method of manufacturing the light emitting diode 400 according to this exemplary embodiment includes the processes described with reference to FIG. 7A, FIG. 7B, FIG. 8A, FIG. 8B, FIG. 9A, FIG. 9B, FIG. 10A, FIG. 10B, FIG. 11A, FIG. 11B, FIG. 12A, FIG. 12B, FIG. 13A, FIG. 13B. Thus, detailed description thereof will be omitted for clarity and the following description will be given of processes after the process described with reference to FIG. 13A and FIG. 13B.

Referring to FIG. 22A and FIG. 22B, after formation of the first and second bump pads 39a, 39b, a lower surface of the substrate 21 is subjected to grinding to reduce the thickness of the substrate 21 and a roughened surface R is formed on the ground lower surface of the substrate 21. The lower surface of the substrate 21 may be ground by lapping and/or polishing and the roughened surface R may be formed by dry and wet etching.

The roughened surface R may be divided into a plurality of regions using a mask. Thus, a flat surface may be formed between the regions in which the roughened surface R is formed.

Herein, the roughened surface R may have any height, for example, a height of 1 μm or more.

Next, a method of forming the side reflection layer 41 on the side surface of the substrate 21 will be described with reference to FIG. 23A, FIG. 23B, FIG. 23C, FIG. 23D, FIG. and 23E. Although FIG. 23A, FIG. 23B, FIG. 23C, FIG. 23D, FIG. and 23E show two light emitting diode regions formed by the processes described with reference to FIG. 22A and FIG. 22B, a larger number of light emitting diode regions may be formed on the substrate 21, and the mesa M and the bump pads 39a, 39b may be formed on each of the light emitting diode regions.

Figure 23A:
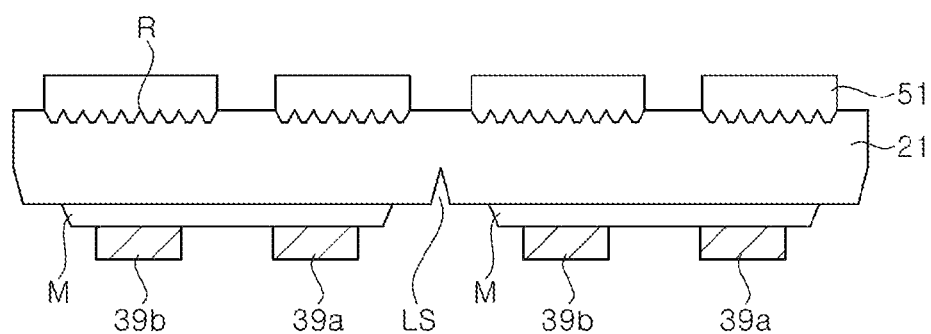

Referring to FIG. 23A, after formation of the first and second bump pads 39a, 39b, a scribing line LS is formed from the first conductivity type semiconductor layer 23 (see FIG. 22B) into the substrate 21 (see FIGS. 15A and 16A). The scribing line LS corresponds to an isolation region between light emitting diodes and thus a plurality of scribing lines LSs may be formed in a mesh shape on the substrate 21.

A photoresist layer 51 is formed on the substrate 21 having the roughened surface R thereon. The photoresist layer 51 may be formed on the substrate 21 by forming a photoresist layer on the substrate 21 through spin coating or the like, followed by patterning the photoresist layer through photolithography and development. As a result, flat regions on the upper surface of the substrate 21 can be exposed.

Figure 23B:
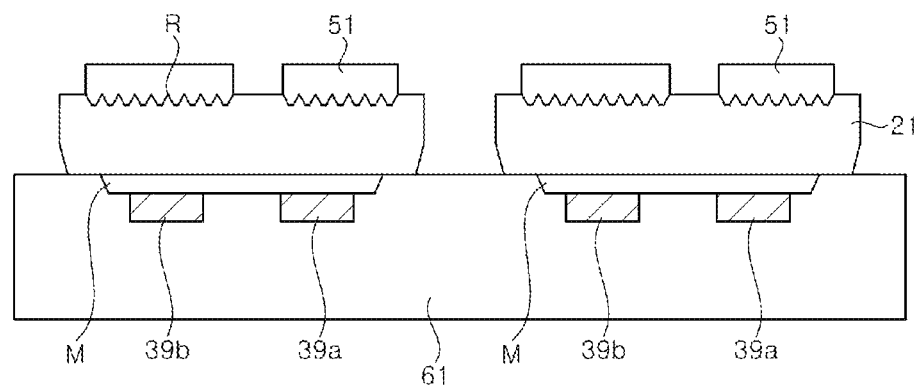

Referring to FIG. 23B, individual light emitting diode regions are divided from each other on a stretchable tape such as a blue tape, which in turn is stretched to separate the individual light emitting diode regions from each other. Thereafter, the divided individual light emitting diode regions are transferred to a UV curable tape 61 (also referred to as tape 61 and support 61) such that the individual light emitting diodes can be attached thereto. Here, the mesa M may be embedded in the tape 61 such that the first conductivity type semiconductor layer 23 exposed around the mesa M can adjoin an upper surface of the tape 61. However, it should be understood that other implementations are also possible. A contact region between the light emitting diode regions and the support 61 may be adjusted and the first conductivity type semiconductor layer 23 may be partially embedded in the tape 61 in the thickness direction.

The side surface of the substrate 21 in each of the individual light emitting diode regions may have an inclined side surface formed by scribing and a perpendicular side surface formed by breaking.

Figure 23C:
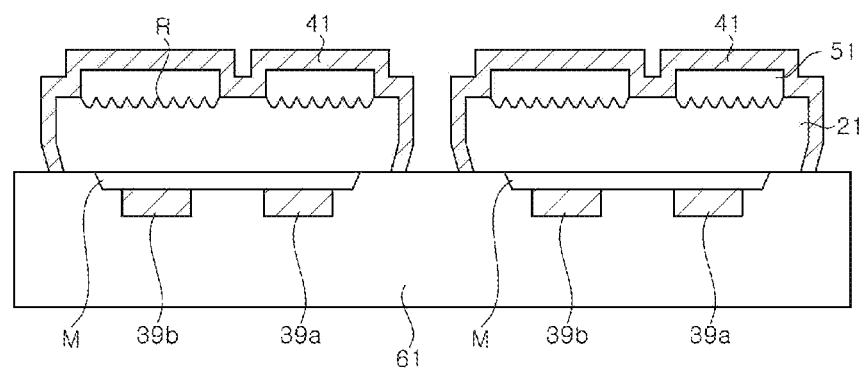

Referring to FIG. 23C, a side reflection layer 41 is deposited on each of the individual light emitting diode regions. The side reflection layer 41 may be deposited thereon by, for example, sputtering. The side reflection layer 41 includes a metal reflection layer such as an Ag layer or an Al layer. The side reflection layer 41 is the same as the side reflection layer described with reference to FIG. 19 and FIG. 20 and detailed description thereof will be omitted.

The side reflection layer 41 is formed on the side surface of the substrate 21 to have a substantially uniform thickness on the inclined side surface and the perpendicular side surface. The side reflection layer 41 covers the photoresist layer 51 and the upper surface of the substrate 21 exposed through the photoresist layer 51.

Since the exposed surface of the first conductivity type semiconductor layer 23 is shielded by the tape 61, the side reflection layer 41 is prevented from being formed on the exposed surface of the first conductivity type semiconductor layer 23. Therefore, the side reflection layer 41 can be prevented from overlapping the first pad metal layer 35a.

Figure 23D:
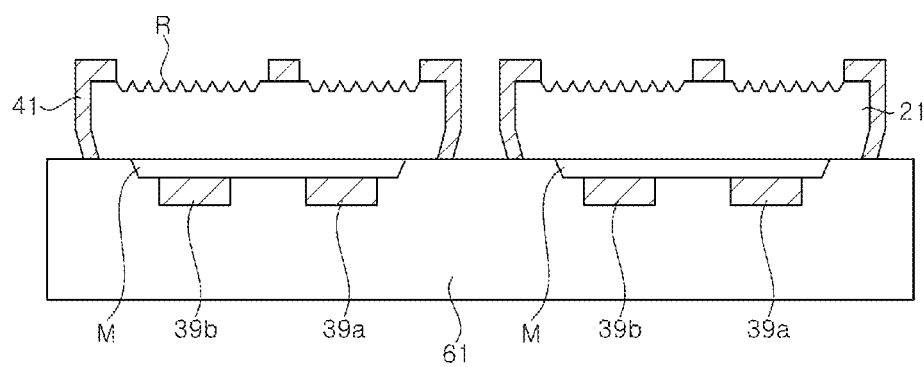

Referring to FIG. 23D, the reflection material layer can be removed together with the photoresist layer from the upper side of the substrate 21 excluding the side reflection layer 41 formed on the side and upper surfaces of the substrate 21 by removing the photoresist layer 51. As a result, the side reflection layer 41 covering the side surface and a portion of the upper surface of the substrate 21 can be formed.

Figure 23E:
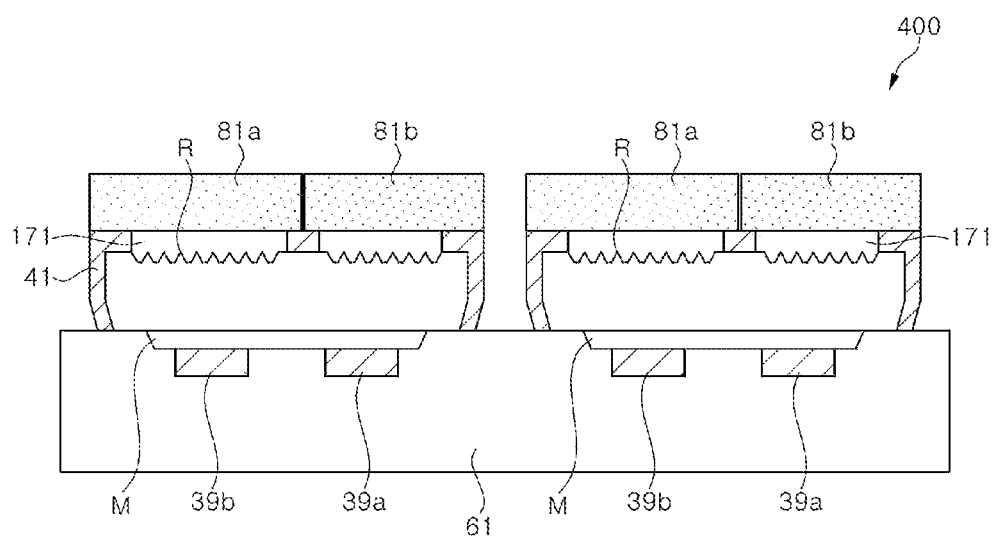

Referring to FIG. 23E, a plurality of wavelength converters 81a, 81b is attached to the upper surface of the substrate 21. The wavelength converters 81a, 81b may be attached to the substrate via a bonding agent 171, or may be bonded to the side reflection layer 41 formed on the upper surface of the substrate 21. Then, the individual light emitting diodes are separated from the tape 61, thereby providing the light emitting diodes 400 as shown in FIG. 19.

The first and second wavelength converters 81a, 81b may include a phosphor-containing wavelength conversion sheet or ceramic plate phosphors (ceramic plate phosphor), particularly, phosphor-in-glass (PIG) or SiC phosphors. Particularly, the ceramic plate phosphor does not suffer discoloration under high temperature conditions and thus can be used for a long time.

The plural wavelength converters 81a, 81b may include different kinds of phosphors. For example, the wavelength converter 81a may include phosphors that emit green light through wavelength conversion of light generated from the active layer 25, and the wavelength converter 81b may include phosphors that emit red light through wavelength conversion of the light generated from the active layer 25. With the active layer 25 configured to emit blue light, the light emitting diode can emit white light through combination of light generated from the active layer 25 and light subjected to wavelength conversion by the wavelength converters 81a, 81b.

Although the light emitting diode includes two wavelength converters 81a, 81b in this exemplary embodiment, a larger number of wavelength converters may be provided to the light emitting diode. For example, the light emitting diode may further include a wavelength converter containing blue phosphors. In this light emitting diode, the active layer 25 is configured to emit UV light and white light can be realized through combination of light subjected to wavelength conversion by the wavelength converters.

Although this exemplary embodiment provides the light emitting diode 400 configured to emit white light, it should be understood that other implementations are also possible and a mixed color can be realized using the plurality of wavelength converters 81a, 81b.

Although the scribing line LS is formed using a laser in this exemplary embodiment, the scribing line LS may be formed using a blade. In this case, the inclined side surface of the substrate 21 may be formed to have a gentler inclination.

In addition, although the scribing line LS is formed after formation of the first and second bump pads 39a, 39b in this exemplary embodiment, the scribing line LS may also be formed before formation of the upper insulation layer 37. In this case, the upper insulation layer 37 may be formed inside the scribing line LS, thereby providing the light emitting diode 200 as shown in FIG. 21.

Figure 24:
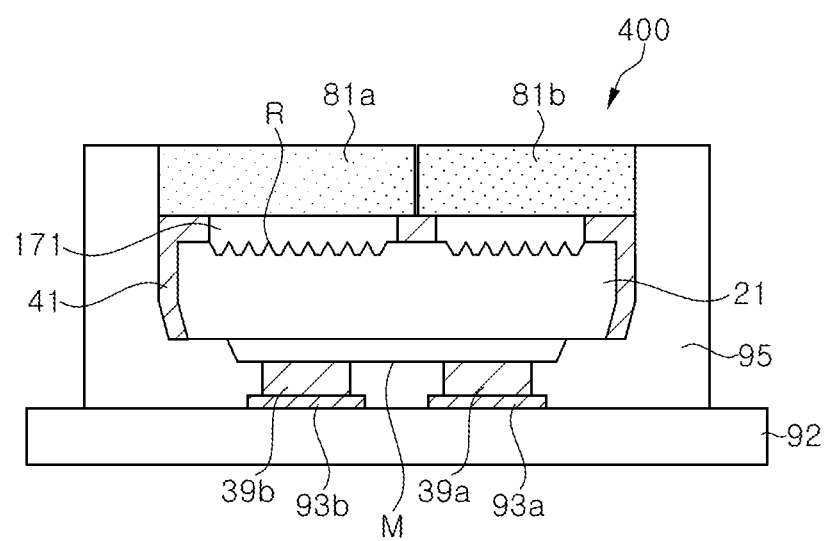
FIG. 24 is a schematic cross-sectional view of a light emitting device according to an exemplary embodiment.

FIG. 24 is a schematic cross-sectional view of a light emitting device according to an exemplary embodiment.

A light emitting diode 400 is the same as the light emitting diode described with reference to FIG. 19 and FIG. 20, and is flip bonded onto a support substrate 92, on which first and second pads 93a, 93b are disposed, via the first and second bump pads 39a, 39b. The support substrate 92 may be, for example, a submount, a printed circuit board, or a lead frame.

A white barrier layer 95 may cover a side surface of the light emitting diode 400. The white barrier layer 95 may be formed by mixing, for example, $TiO_2$ with a silicone resin or an epoxy resin. The white barrier layer 95 can have defects such as cracks therein over time. Thus, when the white barrier layer 95 is directly formed on the side surface of the light emitting diode without the side reflection layer 41, light emitted from the light emitting diode can leak through the white barrier layer 95. However, according to this exemplary embodiment, the side reflection layer 41 is formed on the side surface of the light emitting diode, thereby providing a light emitting device that does not suffer from light leakage even after use for a long period of time. Alternatively, the white barrier layer 95 can be omitted.

Although the light emitting device employs the light emitting diode 400 flip bonded to the support substrate 92 in this exemplary embodiment, the light emitting device may employ the light emitting diode 200 of FIG. 21 mounted on the support substrate 92.

The light emitting device according to this exemplary embodiment is suitable for applications to, for example, automobile headlamps, which are operated under conditions of high current density and high temperature, and may also be applied to various lighting apparatuses. Particularly, the light emitting device according to this exemplary embodiment may be applied to the light source module described with reference to FIG. 18.

Although certain exemplary embodiments have been described herein, it should be understood by those skilled in the art that these embodiments are given by way of illustration only, and that various modifications, variations, and alterations can be made without departing from the scope of the invention. Therefore, the scope of the invention should be limited only by the accompanying claims and equivalents thereof.

What is claimed is:

1. A light emitting diode, comprising:
a substrate comprising an upper surface and side surfaces;
a semiconductor stack disposed under the substrate and comprising a first conductivity type semiconductor layer, a second conductivity type semiconductor layer, and an active layer interposed between the first conductivity type semiconductor layer and the second conductivity type semiconductor layer; and
a light blocking layer covering the upper surface and the side surfaces of the substrate to define a light emitting surface on the upper surface of the substrate,
wherein the light emitting surface is divided into a plurality of regions by the light blocking layer.

2. The light emitting diode according to claim 1, wherein the light emitting surface has a smaller area than the upper surface of the substrate.

3. The light emitting diode according to claim 2, wherein the light blocking layer covers the upper surface of the substrate along an edge of the upper surface of the substrate.

4. The light emitting diode according to claim 3, wherein the light emitting surface has a circular shape, an elliptical shape or a polygonal shape.

5. The light emitting diode according to claim 1, wherein each of the plurality of regions has the same shape.

6. The light emitting diode according to claim 1, wherein a first region of the plurality of regions surrounds a second region of the plurality of regions.

7. The light emitting diode according to claim 1, wherein the light blocking layer comprises a metal reflection layer or a distributed Bragg reflector.

8. The light emitting diode according to claim 1, wherein the light blocking layer disposed on the upper surface of the substrate has a larger thickness than the light blocking layer disposed on the side surfaces of the substrate.

9. The light emitting diode according to claim 1, further comprising:
an ohmic reflection layer electrically connected to the second conductivity type semiconductor layer; and
a first bump pad and a second bump pad disposed under the ohmic reflection layer and electrically connected to the first conductivity type semiconductor layer and the second conductivity type semiconductor layer, respectively.

10. The light emitting diode according to claim 9, wherein the light emitting diode comprises a mesa disposed on the first conductivity type semiconductor layer,
the mesa comprising the active layer and the second conductivity type semiconductor layer,
the mesa being spaced apart from the side surfaces of the substrate, and
the light blocking layer is spaced apart from the mesa in a lateral direction.

11. The light emitting diode according to claim 1, wherein the substrate is a sapphire substrate or a gallium nitride-based substrate.

12. The light emitting diode according to claim 1, wherein the substrate has a roughened surface formed on the upper surface of the substrate such that light generated from the active layer is configured to be discharged through the roughened surface.

13. The light emitting diode according to claim 12, wherein the roughened surface is disposed only on the light emitting surface.

14. A light emitting diode, comprising:
a substrate comprising an upper surface and side surfaces;
a semiconductor stack disposed under the substrate and comprising a first conductivity type semiconductor layer, a second conductivity type semiconductor layer, and an active layer interposed between the first conductivity type semiconductor layer and the second conductivity type semiconductor layer;
a light blocking layer covering the upper surface and the side surfaces of the substrate to define a light emitting surface on the upper surface of the substrate;

an ohmic reflection layer electrically connected to the second conductivity type semiconductor layer;

a first bump pad and a second bump pad disposed under the ohmic reflection layer and electrically connected to the first conductivity type semiconductor layer and the second conductivity type semiconductor layer, respectively;

a lower insulation layer covering the ohmic reflection layer and comprising a first opening exposing the first conductivity type semiconductor layer and a second opening exposing the ohmic reflection layer;

a first pad metal layer disposed on the lower insulation layer and electrically connected to the first conductivity type semiconductor layer through the first opening;

a second pad metal layer disposed on the lower insulation layer and electrically connected to the ohmic reflection layer through the second opening; and an upper insulation layer covering the first pad metal layer and the second pad metal layer, the upper insulation layer comprising a first opening exposing the first pad metal layer and a second opening exposing the second pad metal layer, wherein the light emitting diode comprises a mesa disposed on the first conductivity type semiconductor layer, the mesa comprising the active layer and the second conductivity type semiconductor layer, wherein the mesa is spaced apart from the side surfaces of the substrate, and the light blocking layer is spaced apart from the mesa in a lateral direction, and wherein the first and second bump pads are disposed on the upper insulation layer and electrically connected to the first pad metal layer and the second pad metal layer through the first opening and the second opening of the upper insulation layer, respectively.

15. The light emitting diode according to claim 14, wherein the mesa comprises a through-hole formed through the second conductivity type semiconductor layer and the active layer to expose the first conductivity type semiconductor layer, and the first pad metal layer is electrically connected to the first conductivity type semiconductor layer exposed through the through-hole.

16. The light emitting diode according to claim 15, wherein the mesa further comprises side surfaces and an indented portion formed on the side surfaces of the mesa to expose the first conductivity type semiconductor layer, and the first pad metal layer is electrically connected to the first conductivity type semiconductor layer exposed through the indented portion.

17. The light emitting diode according to claim 16, wherein the mesa has cut off corners and the first pad metal layer is electrically connected to the first conductivity type semiconductor layer at the cut off corners of the mesa.

18. A light emitting diode, comprising:
a substrate comprising an upper surface and side surfaces;
a semiconductor stack disposed under the substrate and comprising a first conductivity type semiconductor layer, a second conductivity type semiconductor layer, and an active layer interposed between the first conductivity type semiconductor layer and the second conductivity type semiconductor layer; and
a light blocking layer covering the upper surface and the side surfaces of the substrate to define a light emitting surface on the upper surface of the substrate,
wherein the side surfaces of the substrate comprise a perpendicular side surface perpendicular to an upper surface of the first conductivity type semiconductor layer and an inclined side surface oblique with respect to the perpendicular side surface.

* * * * *